US008742532B2

(12) United States Patent
Rey Garcia et al.

(10) Patent No.: US 8,742,532 B2
(45) Date of Patent: Jun. 3, 2014

(54) DOPANT APPLICATOR SYSTEM AND METHOD OF APPLYING VAPORIZED DOPING COMPOSITIONS TO PV SOLAR WAFERS

(75) Inventors: Luis Alejandro Rey Garcia, Long Beach, CA (US); Peter G. Ragay, Anaheim, CA (US); Richard W. Parks, Port Angeles, WA (US)

(73) Assignee: TP Solar, Inc., Paramount, CA (US)

( * ) Notice: Subject to any disclaimer, the term of this patent is extended or adjusted under 35 U.S.C. 154(b) by 335 days.

(21) Appl. No.: 13/230,481

(22) Filed: Sep. 12, 2011

(65) Prior Publication Data
US 2012/0149182 A1 Jun. 14, 2012

Related U.S. Application Data

(60) Provisional application No. 61/422,309, filed on Dec. 13, 2010.

(51) Int. Cl.
*H01L 31/102* (2006.01)
(52) U.S. Cl.
USPC .......................................... 257/463; 118/719
(58) Field of Classification Search
None
See application file for complete search history.

(56) References Cited

U.S. PATENT DOCUMENTS

| | | | |
|---|---|---|---|
| 3,299,196 A | 1/1967 | Lasch, Jr. et al. | |
| 3,828,726 A | 8/1974 | Dietze et al. | |
| 4,516,897 A | 5/1985 | Snider et al. | |
| 4,652,463 A | 3/1987 | Peters | |
| 4,834,020 A * | 5/1989 | Bartholomew et al. | 118/719 |
| 5,194,406 A | 3/1993 | Bok et al. | |
| 5,387,546 A | 2/1995 | Maeda et al. | |
| 5,740,314 A | 4/1998 | Grimm | |

(Continued)

FOREIGN PATENT DOCUMENTS

WO WO2008002904 A1 1/2008

OTHER PUBLICATIONS

20%-Efficient Silicon Solar Cells with Local Contact to the a-Si-Passivated Surfaces by Means of Annealing (COSIMA), Plagwitz, H., et al., Institut fur Solarenergieforschung GmbH, Hamein/Emmerthal (ISFH), Am Ohrberg 1, D-31860, Emmerthal, DE, Proceedings of 20th European Photovoltaic Solar Energy Conference, Barcelona, Spain, 2005, 4 pages.

(Continued)

*Primary Examiner* — Charles Garber
*Assistant Examiner* — Andre' C Stevenson
(74) *Attorney, Agent, or Firm* — Jacques M. Dublin, Esq.; Innovation Law Group, Ltd.

(57) ABSTRACT

Silicon wafer processing system, apparatus and method of doping silicon wafers with hot concentrated acid dopant compositions for forming p-n junction and back contact layers during processing into PV solar cells. Highly concentrated acid dopant is atomized with pressurized gas and heated in the range of 80-200° C., then introduced into a concentrated acid vapor processing chamber to apply vapor over 1.5-6 min to wafers moving horizontally on a multi-lane conveyor system through the processing chamber. The wafers are dried and forwarded to a diffusion furnace. An optional UV pre-treatment assembly pre-conditions the wafers with UV radiation prior to dopant application, and doped wafers may be post-treated in a UV treatment module before being fired. The wafers may be cooled in the processing chamber. Post-firing, the wafers exhibit excellent sheet resistance in the 60-95Ω/sq range, and are highly uniform across the wafers and wafer-to-wafer.

16 Claims, 14 Drawing Sheets

(56) References Cited

U.S. PATENT DOCUMENTS

| | | | |
|---|---|---|---|
| 5,820,679 A | 10/1998 | Yokoyama et al. | |
| 5,939,831 A * | 8/1999 | Fong et al. | 315/111.21 |
| 6,240,610 B1 * | 6/2001 | Ishihara et al. | 29/25.01 |
| 6,301,434 B1 | 10/2001 | McDiarmid et al. | |
| 6,376,804 B1 | 4/2002 | Ranish et al. | |
| 6,461,437 B1 * | 10/2002 | Kubota et al. | 118/719 |
| 6,566,630 B2 | 5/2003 | Kitamura | |
| 6,585,828 B1 * | 7/2003 | Kurita et al. | 134/8 |
| 6,841,006 B2 | 1/2005 | Barnes et al. | |
| 7,514,650 B2 | 4/2009 | Melgaard et al. | |
| 7,805,064 B2 | 9/2010 | Ragay et al. | |
| 7,915,154 B2 | 3/2011 | Piwczyk | |
| 8,007,276 B2 | 8/2011 | Melgaard et al. | |
| 2001/0031229 A1 * | 10/2001 | Spjut et al. | 422/186.3 |
| 2002/0048966 A1 * | 4/2002 | Arao et al. | 438/770 |
| 2002/0084258 A1 | 7/2002 | Martinez | |
| 2002/0190052 A1 | 12/2002 | Kitamura | |
| 2004/0231520 A1 * | 11/2004 | Newman et al. | 96/319 |
| 2007/0238216 A1 | 10/2007 | Park | |
| 2008/0012499 A1 | 1/2008 | Ragay et al. | |
| 2008/0057686 A1 | 3/2008 | Melgaard | |
| 2008/0283090 A1 * | 11/2008 | DeKraker et al. | 134/3 |
| 2009/0053397 A1 * | 2/2009 | Buchner et al. | 427/74 |
| 2010/0003520 A1 * | 1/2010 | Bujard et al. | 428/402 |
| 2010/0018460 A1 | 1/2010 | Singh et al. | |
| 2010/0220983 A1 | 9/2010 | Doherty et al. | |
| 2010/0267188 A1 | 10/2010 | Parks et al. | |
| 2010/0272544 A1 | 10/2010 | Rivollier et al. | |
| 2010/0326477 A1 * | 12/2010 | DeKraker et al. | 134/30 |
| 2011/0013892 A1 | 1/2011 | Ragay et al. | |
| 2011/0188538 A1 | 8/2011 | Melgaard | |
| 2011/0212010 A1 | 9/2011 | Bell | |

OTHER PUBLICATIONS

Tecnofimes solid ceramic roller diffusion furnace, www.tecnofimes. co m/photovoltaic, May 26, 2010, 2 pgs.

SierraTherm XR Series Roller Hearth Diffusion Furnace, www. sierratherm.com/process-applications/solar-cell, 5 pgs, May 26, 2010.

* cited by examiner

DOPANT APPLICATOR SYSTEM AND METHOD OF APPLYING VAPORIZED DOPING COMPOSITIONS TO PV SOLAR WAFERS

CROSS-REFERENCE TO RELATED APPLICATION

This is the Regular US Patent Application corresponding to U.S. Provisional Application Ser. No. 61/422,309 filed Dec. 13, 2010, entitled Dopant Vapor Applicator System and Method of Applying Vaporized Doping Compositions to PV Solar Cell Wafers, the disclosure and priority of which is hereby claimed under 35 U S Code Sections 119ff, and applicable international treaties and accords.

FIELD

The invention relates to high speed, low temperature, continuous, dopant applicator apparatus system for applying a wide range of P and/or B doping compositions to one or more faces of solar cell wafers by hot concentrated acid vapor (vapor including microscopic droplets) deposition, in a high speed operation that results in more uniform dopant layers on the wafer surfaces, both edge-to-edge on a given wafer, and more consistent wafer-to-wafer than is presently possible using commercially available vapor, liquid or spray dopant applicators. The dopant vapor is developed by inert gas atomization of highly concentrated acid (liquid) dopant composition into a heated vapor generated chamber. The heated concentrated acid vapor is then distributed into a doping chamber via one or more oriented slit(s) onto relatively cold wafers passing below the slit(s). Optionally, the vapor may be delivered in the form of plasma, i.e., an electrified hot vapor. A UV wafer treatment step may be used before and/or after doping. The doped wafers are subsequently processed in a diffusion furnace to create a p-n junction surface layer or back surface field layer by diffusion into the silicon or other advanced wafer material.

BACKGROUND

The fabrication of silicon based solar cells requires a number of specialized processes to occur in a specific order. Generally these processes include single crystalline silicon ingots grown in crystal growing furnaces or cast into multi-crystalline blocks in "directional solidification" furnaces. The result of these processes are long, 6-12" diameter (or more) "sausage-shaped" single crystal masses called ingots, or multi-crystalline blocks, from which thin slices of silicon are cut transversely or diagonally with "wire saws" to form rough solar cell wafers. These wafers, whether made up of a single crystal or multiple crystals conjoined together, are then processed to form smooth, thin wafers of thickness in the 140 to 200 micro-meter range. Because of the scarcity of suitable silicon, the current trend is towards making the wafers thinner, currently 180-200 micrometers thick, with 120-140 on the horizon.

Finished raw wafers are then processed into functioning solar cells, capable of generating electricity by the photovoltaic effect. Wafer processing starts with various cleaning and etching operations, followed by a multi-stage process of diffusion which creates a semi-conducting "p-n", junction diode, followed by a third process in which Aluminum paste coatings are screen printed on the wafer front and back sides and then fired into the p-n junction layer, where they act as collectors and grounds, respectively.

The diffusion process starts with doping the silicon substrate wafer, comprising a first stage of applying (coating) one or more types of dopant materials, e.g., a P or/and B-containing composition or compound, to the front and/or back side of the wafers, followed by a second stage of drying the dopant. In a third stage, the dry, dopant-coated wafers are then fired in a diffusion furnace to cause diffusion of the P atoms of the dopant composition into the Si (or other advanced material) wafer substrate to form a thin p-n junction layer.

In a fourth stage, the edges of the diffusion-fired wafers are then cleaned with a laser edge ablater, and the wafers are then coated on the front side with the so-called anti-reflective coating layer, currently blue or brown, depending on the coating materials. Finally, in a fifth stage, the wafers are then screen printed, front and back, with a silver and aluminum composition paste, respectively, which are then dried and fired in a firing furnace to form the fine grid of collectors and back surface contact layers, respectively.

This invention relates to the first and second stages of coating one or more types of dopant compositions to one or more surfaces of the wafers in preparation for being diffusion or co-diffusion fired. Currently, there are three principal modes of applying a phosphoric dopant: A) batch-type tube furnace operation in two stages, first oxidizing the wafer with oxygen at about 400° C., purging with $N_2$ followed by injection of $POCl_3$ gas at 850-1000° C., the total process time being extensive, taking about 30 minutes. In the $POCl_3$ process the wafers are closely stacked back to back in pairs, on edge and oriented generally vertically in boats that are then pushed into the tube furnace in which they are exposed to $POCl_3$ gas. The $POCl_3$ gas process also results in a serious "edge effect," in which the bottom and top edges have a heavier dopant deposition as compared to the center section. Both the top and bottom deposition areas are arc-shaped side-to-side each opposed corner being covered with a thinner web at top and bottom center joining the larger corner areas. This pattern is thought to be an artifact of the close spacing of the pair of wafers, being separated in the boats, by on the order of 3-6 mm.

The result for $POCl_3$ gas batch processing is that the upper "A band", center "B zone" and bottom "C band" each have relatively consistent resistance values when measured laterally across the wafer, but the values vary widely top zone to center to bottom zone, when measured vertically from top to bottom. In order to obtain better consistency across the wafer in both lateral and vertical directions and wafer to wafer, resistance values are sacrificed. That is, while high spot resistance values of 80 or higher can be achieved, the consistency is so very poor across the wafer and from wafer to wafer that the wafers can't be used. Thus, in production, the resistance values are backed off, typically down into the 40-55 range, and occasionally as high as 55-65 range.

There are also two aqueous solution processes, using very low concentrations, about 5%, $H_3PO_4$ (orthophosphoric acid) in water; B) spraying the acid solution onto the wafers via an ultrasonic nozzle; or C) passing the wafers through a "waterfall" of the acid solution. In these currently available systems, the wafers are dried in the doper unit.

In the spray or the waterfall aqueous low concentration acid process, the water is on the order of 95% of the solution used, the $H_3PO_4$ being the remaining 5%. At least one spray system employs a mixture of 5% acid, a small percentage of an alcohol as a surfactant, and the balance water. In this variant process, there is poor consistency, wafer-to-wafer, of the dopant coating, and likewise the post-fired diffusion layer is neither even nor consistent.

In both spray and waterfall systems, since so much water is used, there is an extensive drying period on the order of 3-5 minutes per wafer. In the waterfall system, and more recently in a "cloud" system announced by TechnoFimes of Italy, wafers are conveyed through the wetting and drying zones on a disposable roll of special paper. This special paper is required to keep the back side clean, but is single-use, being collected and disposed after the wafers are transferred to the diffusion furnace conveyor. In the ultrasonic spray system, there are two alternative conveyor modes: 1) an O-ring type belt system; and 2) a metal mesh belt system. In the latter, the acidic dopant composition spray comes in contact with the metal mesh and causes contamination of the back surface of the wafer. That necessitates an extra step of etching or ablation of the back surface after diffusion firing.

In addition to the spray and waterfall process problems and limitations, the relatively thick meniscus of fluid on the wafer surface can result in phosphate concentration variations across the wafer during the extended drying period, with the result that the dopant is not evenly coated on the wafer surface, thinner in the center and heavier at the edges. This drying process stage is both slow and difficult to control. In turn, concentration/thickness variations cause uneven thickness of the p-n junction layer formed during diffusion firing. During subsequent metallization firing of the collector grid paste, the fine collector grid lines must burn through the anti-reflective coating into the p-n junction layer. If the junction layer is irregular in thickness and there is burn-through of the collectors, the cell will be short-circuited.

While dopant applicators can be enlarged to increase throughput, the current mismatch in the field is on the order of 3×. That is, a standard doper unit producing 400 wafers per hour feeds a diffusion firing furnace having a 1200 wafer per hour capacity. Thus, the capital requirements at the doper stage must be tripled to keep pace. And, as firing furnace throughput increases, the doper application stage becomes an increasing production bottleneck and adverse capital drain.

Accordingly, there is an unmet need in the solar cell wafer processing art to improve the dopant application stage, both as to speed of application and uniformity, without employing single-use consumable paper transport substrates, without introducing other problems downstream in the overall solar cell wafer production process, and to accomplish this economically off a continuous process having a small equipment footprint, and to match dopant applicator system throughput to the increasing throughput demands of diffusion furnaces, keeping to a 1-to-1 or lower capital equipment ratio so that the doping process is not a solar cell production bottleneck, while producing doped wafers having consistently high resistance value both across each wafer and wafer to wafer.

THE INVENTION

Summary, Including Objects and Advantages

The invention is directed to a continuous, horizontal processing path, dopant applicator system and process for applying a wide range of P and/or B doping compositions to one or more sides of mono- and poly-crystalline solar cell wafers by deposition of hot, highly concentrated orthophosphoric acid vapor, comprising an atomized, high concentration acid vapor plus suspended microscopic droplets, in a controlled atmosphere and temperature chamber, onto cooled wafers in a high speed operation that results in more uniform dopant layers on the wafer surfaces, both edge-to-edge on a given wafer, and more consistent wafer-to-wafer, than is presently achieved using commercially available gas, liquid or spray dopant applicators.

The hot vapor is formed by inert gas atomization of concentrated liquid acid in a temperature controlled vapor generation chamber. The vapor generation chamber temperature is controlled through use of internal IR or resistance lamps and external chamber surface cooling. The heated vapor is directed through a slit onto the top surface of horizontally moving wafers in a vapor deposition process chamber. This application of a carefully controlled flow of concentrated hot acid vapor into contact with the substantially colder wafer top surface results in a uniform dopant acid condensate layer being deposited onto the exposed face of the wafer, this process being herein termed "layering." The inventive layering process also eliminates a lengthy drying stage.

The inventive process also eliminates the need for consumable single-use paper transport substrates, and shortens the time required for the dopant application stage portion of the overall solar cell wafer production cycle. Thus, the inventive layering process directing hot concentrated acid vapor onto cold wafers under controlled atmosphere temperature and pressure conditions permits speeding up dopant application (increasing throughput) in the same footprint as current applicators.

The hot concentrated acid vapor is produced by two principal alternate implementations: First, the presently preferred, embodiment, the concentrated acid vapor is produced by introduction, into a vapor generation chamber, of highly concentrated (undiluted or only moderately diluted) orthophosphoric acid pumped into one or more atomizing nozzles (s), the acid being atomized by injection of one or more streams of pressurized inert carrier gas, such as $N_2$, which gas optionally may be heated. The atomized acid plus carrier gas is heated in the concentrated acid vapor generation chamber or zone, preferably by IR lamp or resistance heaters disposed internal to the chamber, to form a hot vapor of concentrated orthophosphoric acid in the range of from about 80-200° C. Then the hot concentrated acid vapor is distributed onto the wafers via a directed flow plenum system into a vapor deposition chamber through which the wafers are conveyed with the face (surface) to be doped oriented face-up. Any excess vapor condenses out in a colder chamber below the wafer path or is removed and recycled out of inlet and outlet baffle zones.

The concentrated vapor distribution onto the wafers is implemented through a slit entry at the top of the vapor deposition chamber. Alternately vapor may be deposited onto the top face of wafers via a slit tube, analogous to an air curtain or air knife assembly, or through a porous diffusion plate, such as laser perforated alumina, open cell silica, alumina or zirconia foam, silica frit plate, or the like. The directed flow includes drawing the concentrated acid vapor down onto the wafers in a confined zone of the vapor deposition processing chamber, the vapor flow path being implemented via a combination of the input $N_2$ pressure and the negative pressure resulting from the condensation, both on the wafers and excess vapor condensation in a condensation zone below the wafers. Alternately, directed flow may be created by fans in the process chamber and induced draft exhaust of excess vapor, e.g. below the wafers.

In the air knife implementation, directed flow is generated by direction of a curtain of vapor produced by the air knife assembly slit in a substantially laminar flow across the wafer top surface. In this embodiment, the hot vapor is directed onto the top surface of the relatively cold or chilled wafers by a plurality of slotted tubes, similar to air knives, disposed close to and above the wafers as they pass through the vapor deposition processing zone along the transport belts. In this implementation, hot vapor, at positive pressure, is directed in a narrow stream downwardly onto the top surface of the relatively cold or chilled wafers as they pass under the vapor knives, and excess vapor is continuously withdrawn via an induced-draft exhaust, e.g., an $N_2$ eductor, producing continuous laminar flow of the concentrated acid vapor across the top surface of the wafers. In this vapor distribution system, the pressure is generally positive above the wafers and negative below and in the inlet and exit baffle zones.

The formation of the hot concentrated acid vapor by atomization preferably occurs in a separate atomization chamber, the vapor generation chamber or zone, with the resultant hot vapor piped to the top of the vapor deposition process chamber through which the wafers are transported. It is preferred that the atomizer vapor generation chamber is mounted piggy-back style on the top of the vapor deposition process chamber with the vapor exiting downwardly into the vapor deposition chamber. In an alternate embodiment, the vapor generation chamber may be to one side or otherwise relatively remote from the vapor deposition chamber, and connected thereto by a piping manifold.

The wafers are transported through the doper applicator unit by multiple, laterally spaced, continuous loop belts, bands, strands or cords that are continuously cleaned by passing through a sump-type wash tank on the return side of the belt path. The dwell time for the wafers passing through the inventive doper apparatus typically ranges from 1.5-6 minutes. The wafers may be transported continuously through the vapor deposition zone, or the transport may be a semi-batch, indexed (intermittent) movement process flow.

Although the doper apparatus and process can be used by itself, it is preferred to employ a UV pre-treatment apparatus and process step in conjunction with the inventive doping system. We have found that exposure to UV light of the Si wafer face to which dopant composition is to be applied, for a period ranging from 1.5-6 minutes, preferably 2-3 minutes, preconditions the wafer surface to more readily accept the phosphoric or boric acid dopant composition with the result that the doping application is more uniform and concentrated across the wafer, both side to side and top to bottom, and more uniform wafer to wafer. The UV pre-treatment, which may also be supplemented with oxygen, also shortens the processing time for the doping step of the overall Si wafer processing operation. This permits greater throughput for the doping operation to feed the diffusion furnace. The UV pretreatment induces oxidation of the surface layer of the Si wafer top surface thereby promoting condensate nucleation and bonding to the wafer surface in the next-downstream doper apparatus.

Accordingly, the invention includes as an option, but as a preferred embodiment of the inventive doper system apparatus and method, particularly for processing poly-crystalline (also known as multi-crystalline) Silicon wafers, a UV pre-treatment module separated into an upper and lower portion along a horizontal conveyor belt that transports multiple lines of wafers from an input end to an output end. A plurality of lead screw-type lifters are employed to effect the lifting of the upper portion above the lower, fixed portion to permit access to the interior of the housing carrying the lamps, and to the conveyor which remains in place with the fixed lower portion. The output end of the pre-treatment module feeds the lines of the doper at the same process rate, as the pre-treatment module conveyor is preferably slaved to the doper conveyor system.

The upper portion of the UV pre-treatment module includes a plurality of spaced apart UV lamps (exemplary spacing on the order of from about 4" to about 6" apart) oriented transverse to the direction of movement of the wafers. In the presently preferred implementation, 4-16 UV lamps having output in the 10 to 400 nm range may be used, preferably in the UVC range of from about 100-300 nm. A suitable lamp is a low pressure mercury vapor UV lamp having wavelength output including peaks at 184 and 253 nm which are particularly suited to pre-condition the silicon of the wafers by promoting formation of an oxide layer on the surface of the wafer that more readily accepts layering with the concentrated acid dopant composition. The pre-treatment module includes an entry baffle and an exit baffle into which compressed dry air (CDA) or inert gas, optionally supplemented with oxygen, may be introduced via air knife systems. The pre-treatment module may be operated in an atmosphere of CDA or a controlled atmosphere including sufficient oxygen in an inert carrier gas to assist in forming an oxide layer on the wafers.

In a second important alternate implementation, the vapor is directed onto the surface of the wafers in the form of plasma, i.e., an electrified hot fog or vapor. In this embodiment, the hot plasma fog/vapor is positively charged by one or more charge headers, or an electrically conductive porous diffusion plate. The wafers are grounded, preferably by use of belts formed of conductive elastomer, such as a carbon-loaded poly-acrylonitrile rubber or other conductive material such as a nitrided stainless steel. The electrified hot plasma fog is attracted to the grounded wafers, forming a uniform coating.

In an alternative atomization process for production of the hot concentrated acid vapor, concentrated acid (with or without a minor amount of water) and carrier gas are atomized downwardly through a nozzle into a chamber, such as a glass cylinder that is heated externally by high-intensity IR lamps disposed arrayed around the chamber, e.g., 6 lamps disposed around the exterior wall and directed inwardly. A pressurized jet of $N_2$ gas is directed into the atomizer assembly where it is mixed with the concentrated acid and then atomized downwardly into the irradiated (IR radiation heated) atomization chamber wherein the concentrated hot vapor is formed, suspended in the carrier gas under pressure. A tube connects the atomization chamber to the top of the wafer process chamber. Since the produced hot concentrated acid vapor in the atomization chamber is under pressure, and the vapor chamber is being continuously exhausted by induced draft fan or compressed air venturi (eductor) from below, the hot concentrated acid vapor is withdrawn from the atomization chamber and introduced into the vapor zone of the wafer processing chamber to coat the wafers.

In all embodiments, the $N_2$ is inlet in the range of from about 16-30 psig to atomize the liquid acid composition in the atomization chamber to produce the hot concentrated acid vapor. At the inlet into the process chamber vapor zone the hot concentrated acid vapor is at just slightly above atmospheric pressure, e.g., on the order of 0.1 to about 0.5 psig, to prevent external, potentially contaminated, air leakage into the vapor zone. The processing chamber is maintained slightly negative at its exhaust port to induce flow. However, there remains a positive pressure differential between the atomizer vapor generation chamber and the vapor coating process chamber, so that the acid condensation flows into the process chamber where condensation occurs on the relatively cooler wafers. The process chamber interior is not heated although the roof may be heated just enough to deter condensation on the roof that could result in acid droplets dripping off onto the wafers. The wafers are exposed in the process vapor coating zone to the atmosphere of concentrated orthophosphoric acid and the acid coats, or condenses on, the wafer top surface as it flows through the process chamber vapor zone. It is preferred to provide gas knives, providing pressurized filtered air or a carrier gas such as $N_2$ at room temperature, at the wafer/belt entrance and exit to prevent infiltration of ambient exterior air and escape of acid vapor exterior of the vapor zone and processing chamber.

It is presently preferred to direct the hot process vapor into the chamber in a manner to load the processing chamber vapor zone with concentrated acid vapor but without creating currents that result in turbulence at the wafer surface level. Thus, the flow of the vapor through the chamber can be described as ranging from quiescent to gently laminar. In the implementation wherein vapor knives are used, the flow rate and direction is oriented to provide laminar flow so as to not lift the wafers up or off the transfer belts. The hot concentrated acid process vapor is introduced above the wafers through the top of the chamber (or alternately or additionally through one or more side walls adjacent the chamber top) into the vapor zone. Depleted vapor is withdrawn from the bottom of the chamber after passing over the wafers. The depleted vapor may be extracted in a wide range of manners, including ID fans, eductors employing compressed air or $N_2$ gas venturies, or chimneys that created an induced draft. The hot concentrated acid vapor is relatively heavy and viscous, and accordingly the vapor in the atomizer chamber and the process vapor chamber may be characterized as a white vapor, optically dense as a fog, and that moves in a fluid manner.

In addition, the concentrated orthophosphoric acid is relatively hygroscopic. Accordingly, it is preferred that humidity be kept out of both the atomizer vapor generation chamber, the processing chamber and vapor zone. This may be implemented by maintaining the atmosphere in which the process equipment is located being dehumidified, or/and the pressurized $N_2$ and the compressed air to the air curtain knives "sealing" the entrance and exit of the doping applicator apparatus are maintained dry, by passing through suitable sorbent column or vapor traps before use.

The processing chamber includes lateral (transverse) vertical end walls, each with a vertically small horizontal slit permitting extension there-through of the belt transport system for introduction and withdrawal of wafers. Internal of the process chamber are suitable additional lateral, horizontal, or/and inclined baffles which confine and direct the vapor flow to assist in controlling the atmosphere within the vapor process chamber. A combination of horizontal and angled ceiling plates, and floors within the chamber below the belt transport, assist in controlling the direction of flow of the introduced vapor, and the spent vapor to the extraction manifold, or/and collection of vapor condensate.

As noted, the transport system is a continuous loop, preferably a plurality of plastic belts, one for each lane of the doper. In the exemplary embodiment described below, the doper has 5 lanes. In an alternate transport system, laterally spaced-apart bands, strands or cords are used, typically as ribbons or round in cross-section. The transport belts or bands are driven by one or more drive rollers, and guided by a series of idler rollers or pulleys along an upper horizontal wafer transport section to move wafers through the process chamber. The belts or bands are guided by redirecting rollers below inclined baffles in a return section. Disposed in the return section adjacent the outlet end is a drive and idler system that provides adjustable tension to the transport belts and bands.

It is preferred that a tension roller is disposed in a tank sump in which clean de-ionized water is continuously introduced and into which run-off condensation from the vapor generation and vapor deposition zones is directed. The belt or bands pass over idler wheels which redirect the belt down into the tank and around the tension roller and back out while being immersed in the water. The water cleans the belt or bands, and the "wash" water is withdrawn over a weir to a drain. The cleaned belt or bands continue back to the inlet end of the unit where they are redirected to form the horizontal wafer transport section. Optionally, counter rotating scrubbing brushes are positioned on the face, or face and back side of the belt or bands to assist in cleaning. The scrubbing brushes preferably include a hollow mandrel on which the brushes are mounted and water supplied at one end of the mandrel. The water exits through holes along the mandrel to wet the brushes with clean water, and continuously rinses the brushes from the core outwardly.

In another important alternate embodiment, the wafers are cooled as they enter the process chamber, or/and as they transit through the process chamber vapor deposition zone to assist condensation of the hot process vapors onto the wafer surface. The water content of the vapor is relatively low, as compared to a spray or waterfall application system. In addition, condensation releases the latent heat of the vapor. Thus, the coated wafers do not need extended drying time; rather, they exit the chamber virtually dry so that they can proceed immediately to the downstream diffusion furnace which the inventive doper system feeds dopant coated wafers for firing.

Where needed, a simple heating system disposed in association with the exit baffle chamber just outside (downstream of) the outlet end of the vapor deposition chamber can be employed to dry the wafers. Preferred heating means includes a radiant light or IR lamp system, or warm dry air, such as compressed dry air (CDA), or $N_2$ gas directed on one or more surfaces of the wafers via baffle air knives. In the alternative, a short baffle-type drying chamber is disposed intermediate the exit of the doper apparatus and the downstream diffusion furnace to provide a preliminary drying transition, for example by use of CDA or IR lamp(s), before introduction of the dried phosphoric acid-coated wafers into the diffusion furnace for formation of the p-n junction layer.

In an important alternative, the drying chamber at the outlet from the doper may include UV lamps to condition the doped wafers for the diffusion firing process, this conditioning resulting in shortening the diffusion firing cycle (post-doping UV conditioning or pre-diffusion conditioning) The UV lamps may be the same as described above for the pre-treatment module, but medium pressure mercury vapor UV lamps are preferred, typically having an output wavelength, λ, in the range of below about 200 nm. This post-doping diffusion firing preconditioning module may be part of the doper system, a separate transition module just upstream of a diffusion furnace, or may be integrated into the first, warm-up zone of the diffusion furnace.

In still another important embodiment, where process plasma (hot charged vapor or fog) is used, the transverse inlet and outlet end baffles interior of the chamber are positively charged to repel the plasma, which helps to prevent leakage of the plasma out the end slits and thereby control the chamber atmosphere. In another alternative, a charge rod can be used at the inlet end of the chamber to provide a negative charge to the wafers. In this embodiment, the belts are made of non-conductive elastomer so that the only discharge of the wafers is by combination with the positively charged plasma. A ground may be provided to provide necessary charge flow, such as a nitrided stainless steel rod or brush system.

It is preferred to include interiorly of the process chamber, including the vapor deposition zone therein, a plurality of small spray nozzles oriented to direct cleaning DI water to the interior surfaces of the chamber for periodic wash-down cleaning. The nozzles are connected by a suitable piping manifold to a metered DI water source and timer. This prevents undue build-up of acid byproducts, such as $POCl_3$, from accumulating on the walls.

In the presently preferred embodiment, the vapor generation system is piggy-backed on top of the process chamber, and includes bottom apertures providing a flow path for the vapor to be introduced directly into the top of the process chamber via one or more slits oriented parallel to the wafer processing path or transverse thereto.

Those skilled in this art will readily recognize and appreciate that implementation of any combination of the various features of the several embodiments described herein can be implemented without undue experimentation. In this regard, the concentrated acid solution introduced into the piggy-back vapor generation chamber is in the range of from about 40 to 86%, with the preferred being in the range of from about 60-85%, and approaches equilibrium in the vapor process chamber. The typical $N_2$ carrier gas flow is on the order of 60-80 c.f./hr, for delivery on the order of from about 1 to about 2 c.f./minute per lane. With respect to the electrified plasma embodiment, the voltage is relatively low, e.g., on the order of from about 1000 to about 2000 Volts. In regard to the UV conditioning of the wafers, that step is optional, but UV pretreatment is preferred to be implemented at the inlet end of the inventive doper system apparatus, and is preferred to be continuous at the same rate wafers are fed into or onto the conveyor belts of the doper. The vapor condensation chamber zone cooling system is optional, but when used, is preferably disposed beneath the belts in at least a portion of the vapor application and condensation processing chamber (the doping chamber). Although belt, ribbon or cord type rubber or polymer belts are presently preferred for the transport system through the doping chamber, passivated metal belts or finger drives may be employed, such as nitrided stainless steel or Nichrome wire belts or side finger-type drives.

The doped wafers are subsequently processed in a diffusion furnace to create an p-n junction surface layer or back surface field layer by diffusion into the silicon or other advanced wafer material. The inventive dopant applicator may be an upstream module mated to a diffusion furnace, and both may be part of an integrated manufacturing line including the subsequent screen printing of fingers and bus bars on the wafer, and subsequent firing of the wafers to form ohmic contacts with the silicon or other wafer material. In a co-firing system, the top side of the wafers is coated with a phosphoric acid dopant and the bottom side is coated with a boric acid dopant.

BRIEF DESCRIPTION OF THE DRAWINGS

The invention is described in more detail with reference to the drawings, in which.

DETAILED DESCRIPTION, INCLUDING THE BEST MODES OF CARRYING OUT THE INVENTION

The following detailed description illustrates the invention by way of example, not by way of limitation of the scope, equivalents or principles of the invention. This description will clearly enable one skilled in the art to make and use the invention, and describes several embodiments, adaptations, variations, alternatives and uses of the invention, including what is presently believed to be the best mode(s) of carrying out the invention.

In this regard, the invention is illustrated in the several figures, and is of sufficient complexity that the many parts, interrelationships, and sub-combinations thereof simply cannot be fully illustrated in a single patent-type drawing. For clarity and conciseness, several of the drawings show in schematic, or omit, parts that are not essential in that drawing to a description of a particular feature, aspect or principle of the invention being disclosed. Thus, the best mode embodiment of one feature may be shown in one drawing, and the best mode of another feature will be called out in another drawing.

All publications, patents and applications cited in this specification are herein incorporated by reference as if each individual publication, patent or application had been expressly stated to be incorporated by reference.

Figure 1:
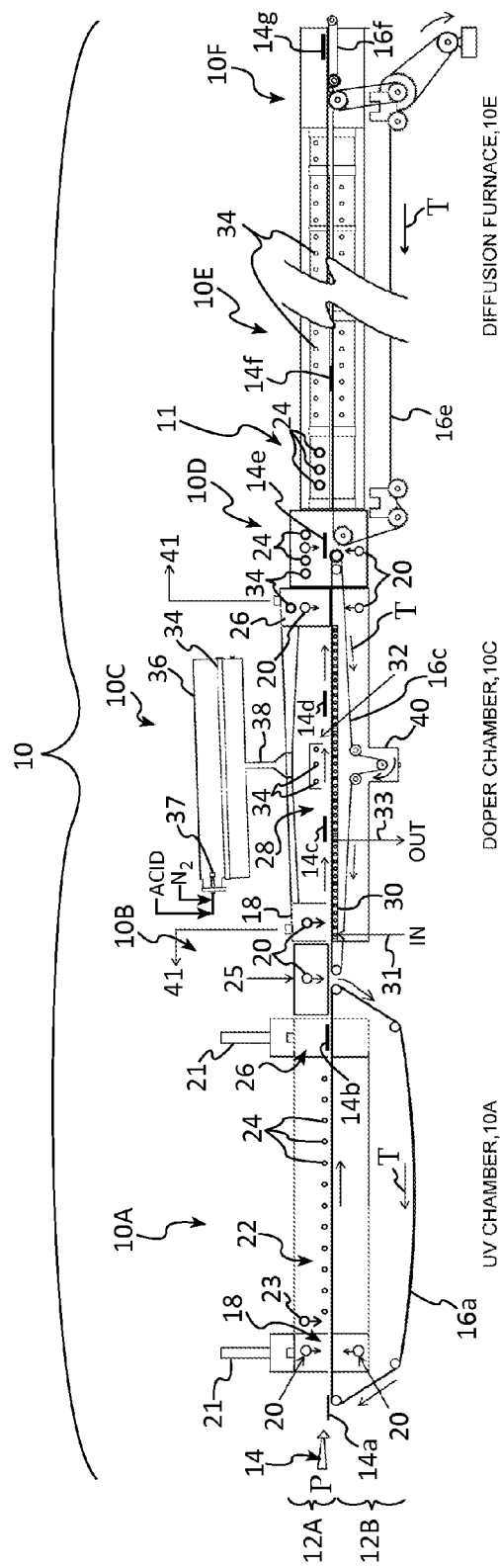
FIG. 1 is a schematic side elevation view, from left to right, of the inventive apparatus system comprising a UV wafer pretreatment module feeding wafers to a doper module, which in turns feeds acid dopant-coated wafers into a diffusion furnace via a short intermediate drying zone.

FIG. 1 shows a schematic of the several modules of the inventive wafer processing system 10, comprising in sequence, from left to right: A) a UV pretreatment module 10A; B) a transfer muffle 10B that optionally but preferably chills the wafers transiting through it with cold $N_2$ gas directed onto the wafer top or/and bottom surfaces; C) a doper module 10C in which the top surface of the wafer is coated with highly concentrated orthophosphoric acid applied as a vapor layer; D) a second transfer muffle that optionally but preferably serves as an auxiliary dryer by directing warm, dry $N_2$ gas onto both the top and bottom surfaces of the acid-coated wafers; and E) a diffusion furnace 10E, which terminates at its outlet end in an exit muffle 10 F having a separate transfer belt as shown. Each of the several modules is preferably divided horizontally into a vertically movable upper half 12a, and a fixed lower half 12b. The wafers 14 are directed by transfer systems 16a through 16f of the several modules along a processing path indicated by the Arrow P on the left. Exemplary wafers in various processing step zones being identified 14a at the entry, through 14g at the transfer belt 16f at the outlet end of the muffle 10F. Wafer 14g ordinarily will be transferred on downstream into an applicator for coating the top surface of the wafer with an anti-reflective coating layer, then dried, screen printed on its top surface with fine collector lines and paste coated on the entire bottom surface for a back contact layer, and finally fired in a metallization furnace to complete the conversion of the wafer into a solar cell.

The UV module includes an entry baffle zone 18 bounded by laterally spaced end walls having a slit just vertically wide enough to admit the wafers on the belt 16a. The entry baffle zone 18 includes air knives 20 positioned above and below the wafers. A controlled atmosphere gas stream may be applied via air knife 23 onto the wafers as they move past on the transfer belts 16a in the UV pre-treatment conditioning zone 22. The controlled atmosphere is preferably selected from compressed dry air (CDA), $O_2$, or an inert gas having a preselected amount of Oxygen, e.g. $N_2$ with from about 5 to about 20% $O_2$; that is, an amount of oxygen sufficient to induce oxidation of the Si wafer top surface thereby promoting condensate nucleation and bonding to the wafer surface in the next-downstream doper apparatus. The air knives 20, 23 assist in providing a positive pressure in the UV module to keep out ambient air and humidity thereby controlling the atmosphere within the UV module. Exhaust stacks 21 are shown for each of the several baffle zones; they may be supplemented with carbon filters.

The main UV pre-treatment chamber 22 includes a plurality of transversely oriented UV lamps 24 spaced along the processing path P to induce oxidation on the top surface of the wafers as they transit from the entry position 14a to the exit 14b. An exemplary UV chamber assembly 22 employs 12 lamps spaced 4.5" apart 3-4" above the belt. The Arrow T associated with the transfer belts 16a, 16C and 16e shows the return direction of the belts; the motion of the wafers 14a-14g is from left to right in FIG. 1. Because of scale, the drive for the UV module is not shown; preferably it is slaved off the doper inlet roller jack shaft to insure that the UV module through-put rate is the same as the doper.

The transfer muffle 10B may be a part of either the UV module 10A or the doper module 10C, or may be an independent module. This transfer muffle 10B provides a transition to the doper module 10C and preferably includes an air knife 20 that directs chilled dry $N_2$ gas 25 onto the top of the wafers to pre-cool them so as to assist in inducing condensation thereon of the concentrated acid vapor applied in the doper wafer processing zone 28.

The doper module 10C includes entry and exit baffle zones 18, 26, respectively, each of which includes air knives 20. Chilled, compressed dry $N_2$ gas is applied through the air knife in the entry baffle zone 18, while heated, compressed dry air or $N_2$ gas is applied through the air knife in the exit baffle zone 26, and in the optional transition drying muffle 10D. The chilled gas cools the wafers while the heated gas dries the wafer after the application of the concentrated acid vapor thereon. Both serve to prevent inspiration of ambient air into the controlled atmosphere of the central wafer processing zone 28 of the doper 10C. Optionally, the wafers are cooled by the use of cold plates or radiators 30 placed under the belts, the radiators being implemented in a plurality of sections that are oriented either transverse to, or parallel to the processing path of travel of the wafers 14c, 14d as they transit through the doper module. The radiators are suitably cooled with chilled water 31 IN and 33 OUT as shown, or a refrigerant fluid may be used, such as ethylene glycol or any of the approved "green" fluorocarbon refrigerants.

As an option, an internal drying zone 32 may be disposed internal of the wafer processing zone 28. This zone comprises transverse entry and exit baffles having belt/wafer entry exit slits and a top that isolates this zone from the acid fog. This drying zone includes one or more high intensity InfraRed (IR) lamps 34, three being shown by way of example. These IR lamps dry the wafers after an initial application of acid to the wafers 14 in a first layering process step as they move to the right from position 14c. Then these wafers are again coated with a second layer of acid as they emerge from the internal drying zone 32, the double coated wafers 14d being dried in the baffle zone 26 and the dryer 10D.

The inventive doper apparatus 10C also includes a hot concentrated acid vapor generation chamber 36, shown in this figure as mounted "piggy-back" above the wafer processing chamber zone 28. The acid vapor generation chamber 36 includes one or more internal IR lamps 34, and concentrated acid and $N_2$ gas is introduced, here shown at the left end. The atomizing nozzle 37 and heat from the lamp produces a hot concentrated acid vapor, which exits via the vapor transfer manifold 38 into the top of the wafer processing zone 28. The wafer transfer belt 16c, on its return path passes through a sump 40 wherein the belts are cleaned by passing through a water bath. Any acid vapor exhausting out the flues of the inlet baffle 18 and the exit baffle 26 is sent to recycle 41, e.g., via sump 40.

Wafer 14d proceeds out through the gas-heated exit baffle zone 26, through the drying module 10D into the diffusion furnace module 10E. Either or both of the exit baffle 26 and the drying module 10D preferably includes air knives 20 delivering Compressed Dry Air or $N_2$ to the wafers to assist in drying them. Both the exit baffle and the drying module 10D may also include halogen or IR lamps 34 to assist in drying acid/water layer on the top surface of the wafer. The dried wafers 14e have a powdery white coating on the top surface as they enter the processing zones of the diffusion furnace 10E.

In an important alternative, the drying chamber 10D at the outlet from the doper module 10C may include one or more UV lamps 24 to condition the doped wafers for the diffusion firing process in furnace 10E/10F. This UV conditioning results in shortening the diffusion firing cycle. The UV lamps 24 preferred for this diffusion preconditioning module are medium power mercury vapor lamps having an output radiation wavelength, λ, in the range of from 10 nm to about 400 nm, preferably below about 200 nm. This post-doping diffusion firing conditioning module may be part of the doper apparatus system 10C or 10A/10B/10C, a separate transition module 10D, or may be integrated into the first, warm-up zone 11 of the diffusion furnace 10E. This conditioning may be considered either a post-doping conditioning, or a pre-diffusion firing conditioning.

The diffusion furnace 10E includes a special conveyor system 16e that does not introduce metal contamination to the wafers. The furnace 10E includes a plurality of zones downstream of the warm-up zone 11, that are heated with high intensity IR lamps, both above and below the conveyor system. The zones are controlled to provide a predetermined, selected thermal profile of heating up and cooling down along the processing path as the wafers proceed from position 14e to the exit position 14f.

All of the modules 10A, 10C and 10E are of the Top-Lift "UP" Access design, in which the lower portion of the module 12b is secured to a framework, and lifters disposed at the corners of each module raises and lowers the upper portion of the module 12 above the transfer belt for access to the belt for servicing. The module lifters are preferably of the lead screw type so that there is no power draw when the modules are in the closed, lowered position, ready for module operation. Typically there is a controller for the doper module 10C from which the UV pretreatment module 10A may be controlled, although the two modules 10A and 10C may be lifted and lowered independently. The diffusion furnace module 10E includes a dedicated controller for its operation, so that it may be lifted and lowered independently of the other modules 10A and 10C. Where the transfer muffles are secured to the upper portion 12A of their adjacent modules, then they may be lifted and lowered along with the respective module, e.g., 10B with 10A and 10D with 10C.

Operating Example

Standard poly-crystalline 6" square Si wafers were processed through the UV pre-treatment module 10A, the doper module 10C including the transfer muffle 10B and the drying module 10D, and then fired in the diffusion furnace 10E. The UV pre-treatment module employed 6 medium-powered lamps spaced in the range of from about 3 to about 6" above the belt. CDA was supplied in the baffles and the pre-treatment chamber. Dwell time in both the UV pre-treatment module and the doper was 2 minutes, each.

The resulting doped and fired wafers in all 5 lines were evaluated with a Jandel Model 3000 Four Point Probing system (available from Bridge Technology, sales@bridgetec.com) to determine the sheet resistance of the wafers at 25 points evenly spaced 1" apart (beginning 1" in from each edge) both laterally across and vertically up/down on the wafers. For technical information on use of four point probing to determine Sheet Resistance and the Calculation of Resistivity, see http://www.four-point-probes.com/short.html. Across 16 exemplary wafers from all lines and across all wafers the resistivity in Ohms/square (the standard measurement metric) was excellent, ranging from a low of 66Ω/sq. to a high of 94.2Ω/sq. at individual points, with deviations from wafer averages ranging from a low of ±2.1Ω/sq. to ±3.16Ω/sq. Averages across entire wafers ranged from 69.44±2.2Ω/sq. to 91.11±2.67Ω/sq.

In comparative testing without using UV pre-treatment on the same type wafers, in terms of resistance across the wafers and wafer to wafer, the uniformity was substantially lower, on the order of >5Ω/sq., twice the deviation than when using a UV pre-treatment step. This demonstrates the unexpected and beneficial results of using the UV radiation pre-treatment upstream of a doping process step.

Figure 2:
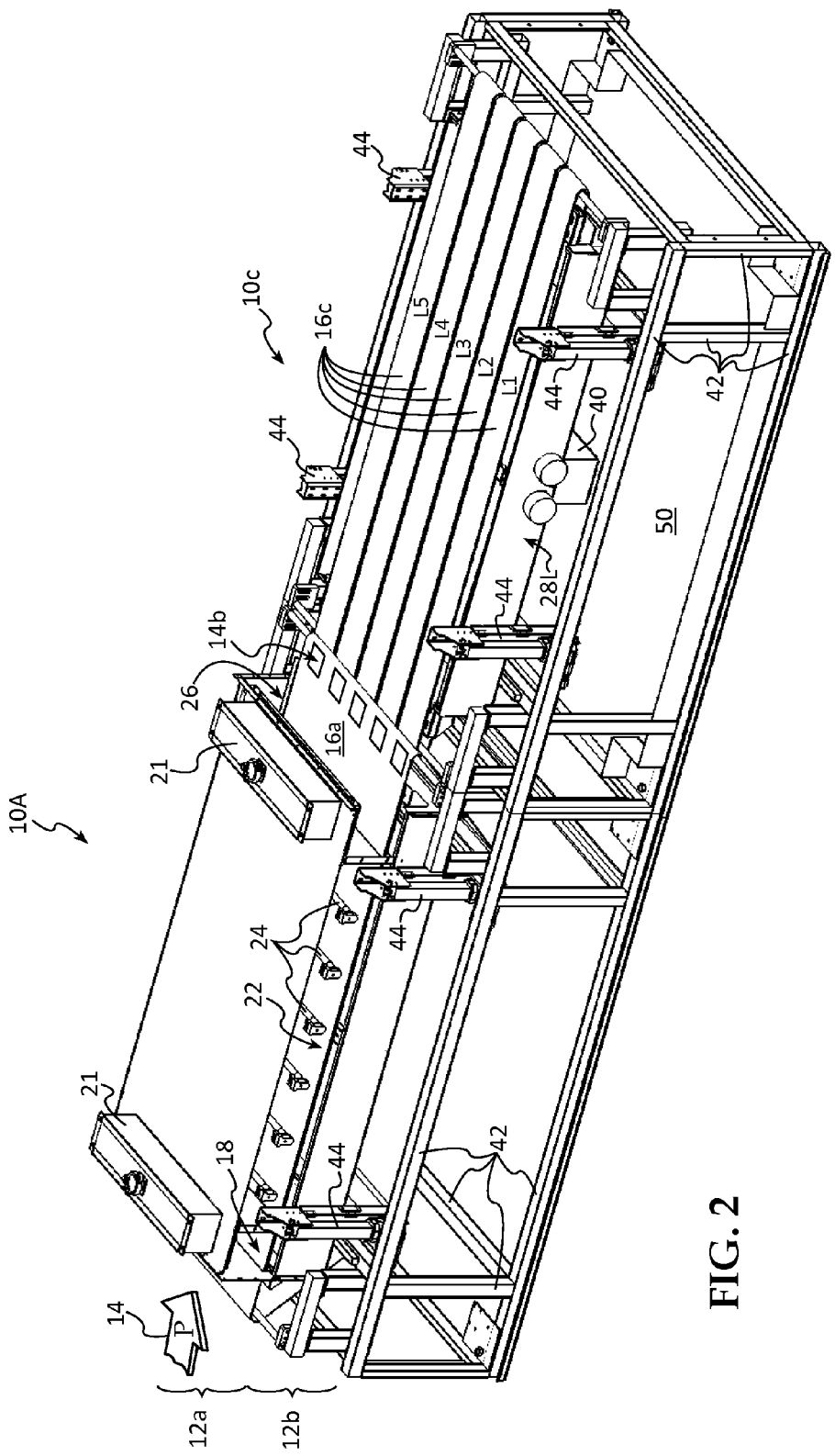
FIG. 2 is an isometric view of the UV module and the doper module, the inlet being on the left and the outlet on the right, with the right side of the UV module's upper half removed to show UV lamps internal to the module, and with the top half of the doper module removed to show the transport belts of the doper.

Returning to the detailed description of the figures, FIG. 2 illustrates in more detail the UV module 10A and doper module 10C, the intermediate transfer muffle 10B being omitted for clarity. Wafer transfer movement is from left to right in this Figure as seen by the Arrow P at the left. In this example, each module is mounted on a frame 42 comprising suitable longitudinal rails, vertical legs and transverse cross members. The system of 4-poster type lead screw type lifters 44 are shown as connected to the upper and lower sections of the UV module 10A so that the upper half can be lifted for access to the transfer belt 16a, on which five wafers 14b are depicted. As can be seen, the lower half 12b is fixed to the frame members 42, while the upper half 12a is vertically movable with respect to the lower half 12b by the lifters 44 working synchronously. The entire upper half 28U of the doper module 10C has been omitted to show its multi-belt embodiment of the transfer system associated with the lower half 28L of the doper module. In this embodiment, the UV pretreatment module has a single belt that is wide enough to transport wafers in a 5-across array, referred to as five lines A-E. Correspondingly, each belt 16c comprises a separate line of the doper, a multi-line doper module 10C embodiment being shown. A single continuous framing system may be employed for both modules, or each module may have its own frame, in which case mating connectors are used to join the two modules in accurate alignment. The doper module lifters 44 are shown, as is the drip pan 50 below the sump 40 of the module to catch any acid spills.

Figure 3:
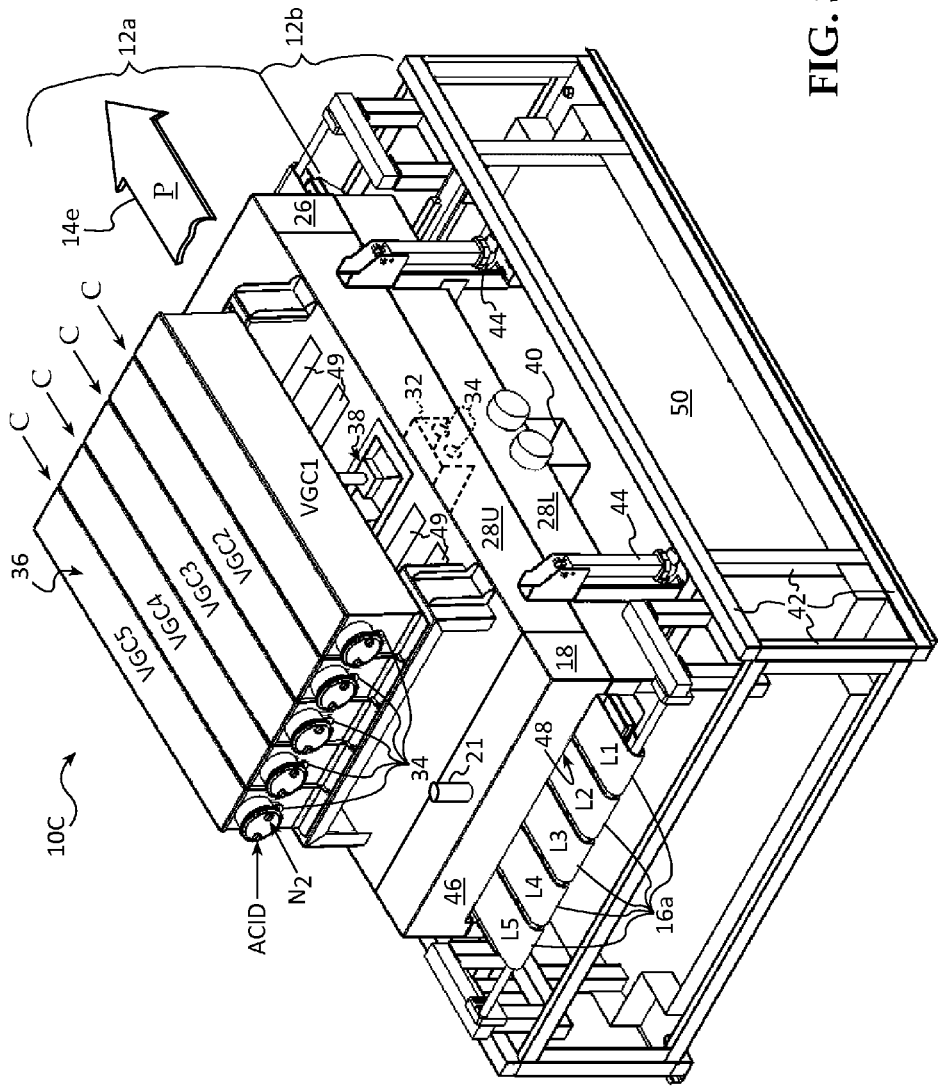
FIG. 3 is an elevated isometric view of the inventive doper module apparatus from the front, right side with the wafer input on the left and the output on the right, and showing the fog prep chamber piggy-backed on top of the wafer processing lane zones, and showing in dashed lines the inclined drip floor baffles internal of the wafer process chamber.

FIG. 3 shows a doper module 10C from the front right, with the upper half 12a (28U) being in operating position, closed down onto the lower, fixed half 12b (28L). The lower half is mounted fixed to the frame members 42, and lifters 44 as described above are secured adjacent the four corners thereof to raise the upper half 12a with respect to the fixed lower half 12b for access to the five belts 16a, one defining each line L1-L5. The wafer processing path, shown as Arrow P, is from left to right and the output doped wafers 14e exit into the downstream diffusion furnace 10E (see FIG. 1). Note the wafer processing chamber 28 is split horizontally in two into upper half 28U and lower half 28L. The entry baffle zone 18 includes a transverse entry end wall 46 having an entry slit 48 through which the UV pre-treated wafers pass on the belts 16c. The same is true of the exit baffle zone 26, that end wall not being visible in this view. Beneath the module is a safety collection tray 50 having raised side walls in case of acid spill. Note that this implementation is a 5-lane doper module, the lanes being defined between outer side walls of 28U and internal, transversely spaced apart longitudinal baffles (not seen in this view), to define lanes L-1 through L-5. Corresponding to each lane is a vapor generation chamber 36, the chambers being identified as VGC1 through VGC5. Each vapor generation chamber 36 is fed $N_2$ gas (optionally humidified) and highly concentrated acid (optionally acid/water mixture) at the left end as shown, by way of example for VGC5. Each vapor generation chamber 36 includes an internal IR lamp 34. The concentrated acid vapor transfer manifold 38 for VGC1 is shown, the others being hidden in this view. Removable panels 49 provide access to optional heaters (not shown) for the internal roof of the process vapor application chamber 28U. The location of the optional internal drying zone 32 with IR lamps 34 is shown in dashed lines. As needed to maintain the IR lamps at full power, the external sides of the vapor generation chambers are air cooled, as shown by Arrows C, a blower channeling air in the gaps between adjacent vapor generation chambers, VGC1 and VGC2, etc.

Figure 4:
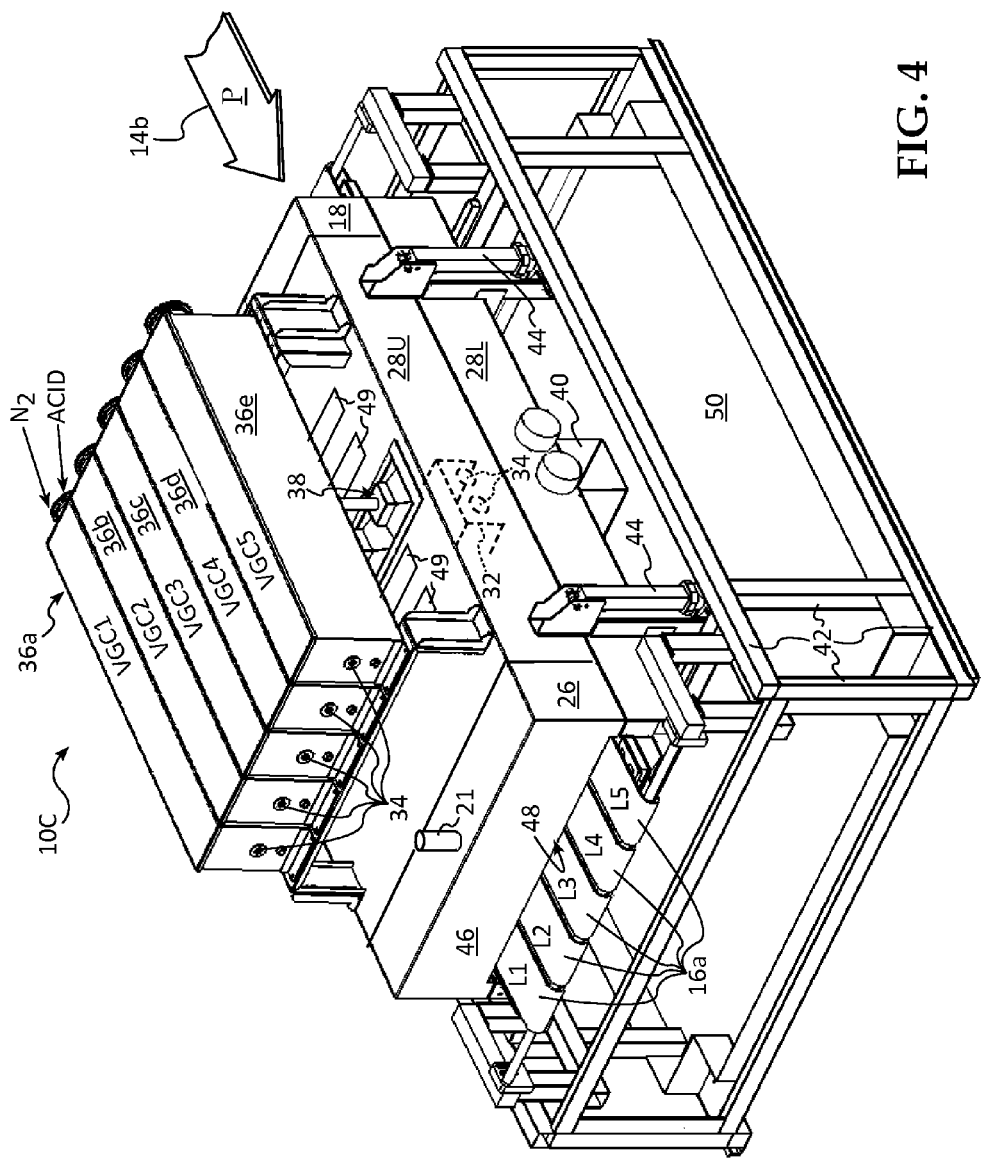
FIG. 4 is an elevated isometric view of the inventive doper module of FIG. 3 from the opposite, back, left (outlet) side.

FIG. 4 is a similar isometric as FIG. 3, but taken from the opposite diagonal corner, the parts being numbered the same. The outlet slit 48 is shown in the transverse end wall 46 of the outlet baffle zone 26, and the IR lamp 34 for each of the vapor generation chambers 36a-36e (VGC1-5) are shown on the left. The location of the optional internal drying zone 32 with IR lamps 34 is identified in both FIGS. 3 and 4, with the access hatches 49 being shown on the top of the upper half module 28U. The input end of the doper for the UV pretreated, undoped wafers 14b is on the right as shown by process path, Arrow P.

Figure 5:
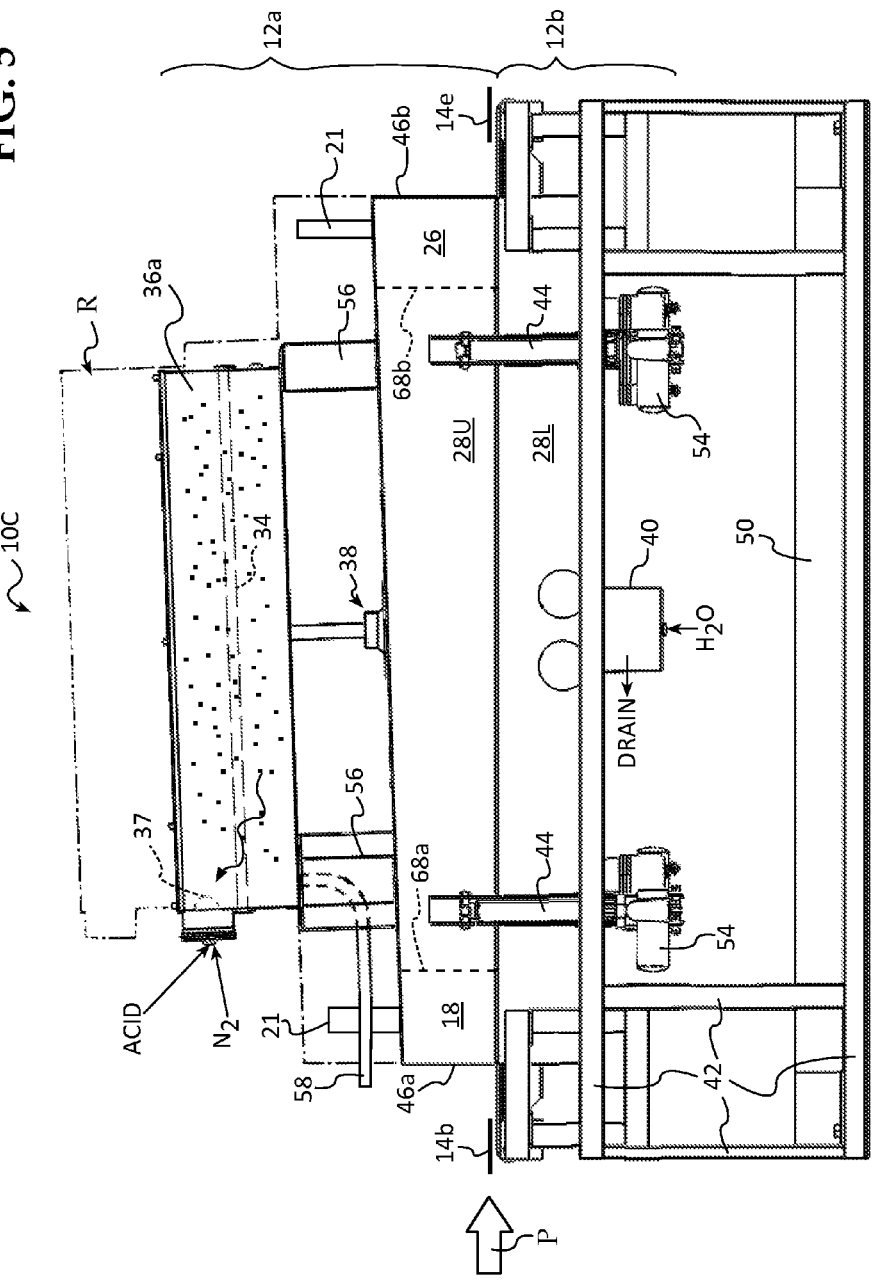
FIG. 5 is a side elevation of the inventive doper module with the front (inlet) on the left and the rear (outlet) on the right, showing the cant of the fog prep chamber to permit drainage.

FIG. 5 is a right side elevation of the doper of FIGS. 3 and 4, illustrated with the same parts numbers, the wafers being transported along path, Arrow P, from entry position 14b on the left to 14e exit on the right. In this view, the side walls of the spill tray 50 are evident. In addition the motors 54 for the lifting jacks 44 are visible. The sump 40 includes a water inlet marked $H_2O$ at the bottom and an overflow weir drain, marked Drain, as shown. The vapor producing chambers 36 are supported at their ends by brackets 56, and the low end at the left includes a drain 58. Note that the left end wall 46a of the inlet baffle zone 18 is shorter than the right end wall 46b of the exit baffle zone 26. Thus, the upper half of the doper vapor application process chamber section 28U has a sloping top wall on which the vapor generation chambers 36a-e are mounted. Since the legs 56 are equal in length at each end, the vapor generation chambers slope downwardly toward the end at which atomizer 37 is located, permitting the vapor generation chambers to drain away any condensate that might form. The internal IR lamp 34 maintains the vapor produced at the selected hot temperature to insure vapor is delivered downwardly via the manifold 38 into the vapor application chamber 28U defined between internal transverse baffle walls 68a and 68b. The atomizer spray and vapor produced is shown schematically on the interior as lines and dots, respectively. The fully raised profile of the upper half of the doper module 12a is shown by the dash-dot lines R, resulting from the actuation of the lifters 44 to lift the vapor generation chamber 28U to provide access to its interior.

Figure 6:
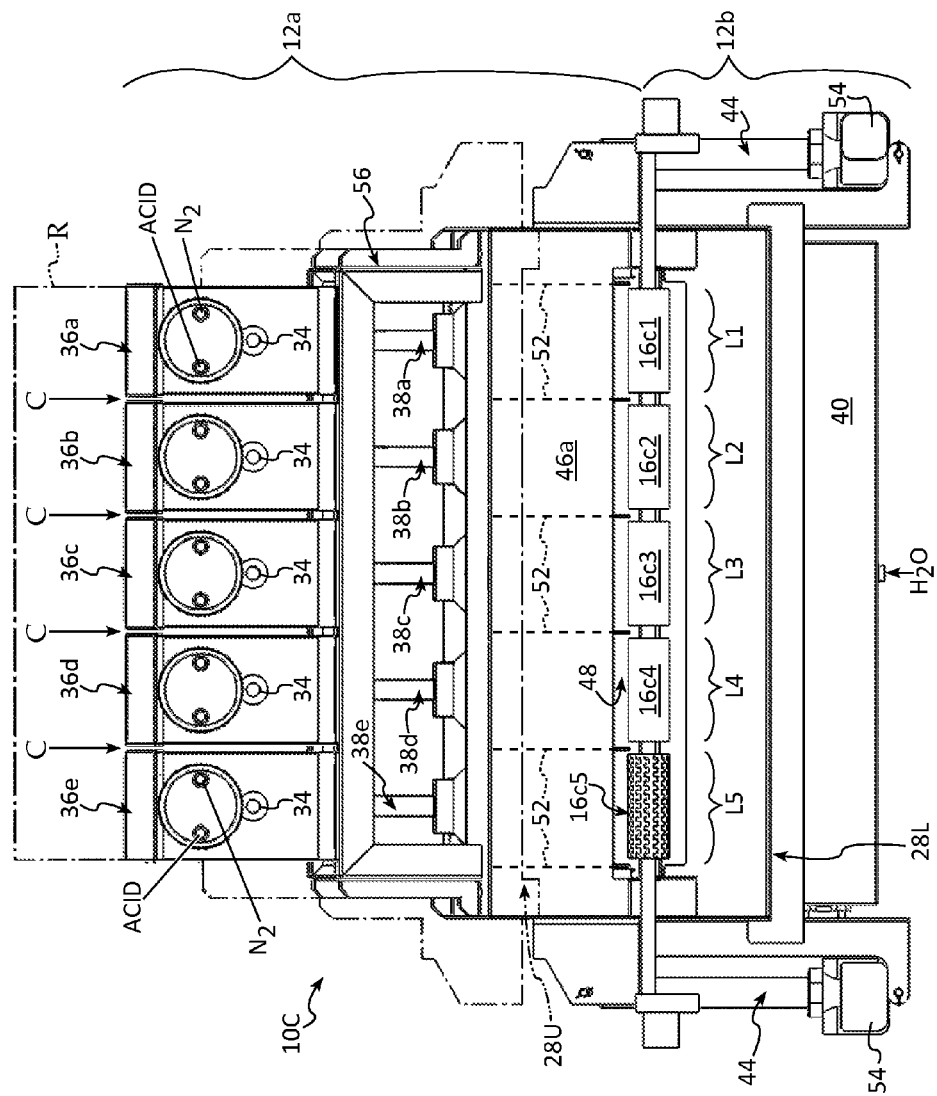
FIG. 6 is a front transverse elevation of the doper module, a portion of the framework being omitted for clarity and scale.

FIG. 6 is an end elevation from the inlet end of the doper 10C, more clearly showing the belts 16c1-16c5 dedicated to individual lines L-1 through L-5, each line being separated by internal longitudinal baffles 52 that can be seen through the entry slit 48. The separate lines for introduction of acid and $N_2$ gas are more clearly seen in the end walls of the acid production chambers 36a and 36e, as well as the power connections for the lamps 34, one for each of the vapor generation chambers 36a-36e. Note that there is a dedicated vapor generation chamber feeding hot concentrated acid via the headers 38a-38e to each separate line L1-L5 defined between the side baffles 52 of each line. The fully raised profile of the upper half of the doper module 12a is shown by the dash-dot lines R, resulting from the actuation of the lifters 44 to lift the vapor generation chamber 28U to provide access to its interior. Note belt 16c5 of line L5 is shown as an acid-resistant plastic link belt, preferably having a non-skid surface.

Figure 7:
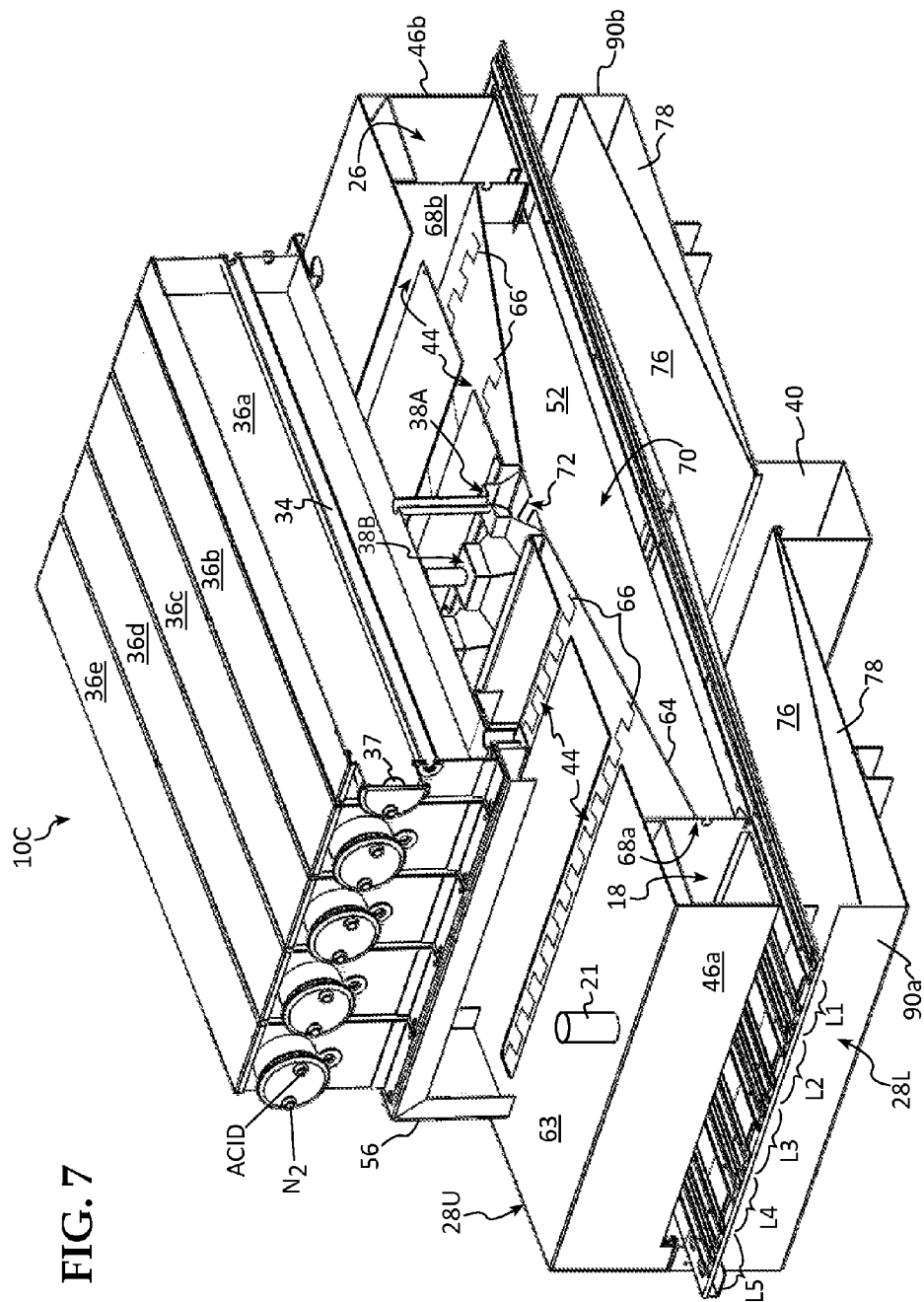
FIG. 7 is an elevated isometric view of the inventive doper module of FIGS. 2-6 from the right side inlet end, showing the right side of the housing removed to reveal the transport system, a first embodiment of the wafer cooling plates, the transport belt washing sump, the various internal baffles that divide the process chamber into zones for each processing lane, and the internals of the fog prep chamber above.

FIG. 7 is an isometric view of the doper module 10C with the right side walls removed to expose lane L1 down its longitudinal (processing path) mid-line. The top of the upper half of the doper module 63 spans between the longitudinal side walls and end walls 46a and 46b. This view shows in the upper half of the doper module 28U, a wafer vapor layering process zone 70, defined between common end walls 68a and 68b. These walls are the inner walls, respectively of the inlet baffle zone 18 and the outlet (drying) baffle zone 26. Thus, the inlet baffle zone 18 is defined between transverse module outer wall 46a and common transverse inner wall 68a, while the outlet baffle zone 26 is defined between the common transverse inner wall 68b and the transverse module outer wall 46b at the outlet end. As the outer right wall of the module 10C has been removed in this view, the inner vertical, longitudinal baffle 52, which is the left side of the lane L-1 zone, can be seen. The heated acid vapor produced in the vapor generation chambers 36a-36e is delivered via the several transfer manifolds 38, 38a and 38b being shown, to the vapor layering process zone 70 via a transverse slit 72. The slit 72 forms a stream or sheet of vapor that is layered onto the top surface of the wafers as they pass along the respective lanes, L1 being shown in detail. The vapor process zone 70 includes a bilaterally slanted ceiling 64 which assists in directing the vapors from the slit down to the belts on which the wafers are passing from left to right in this view to effect the vapor layering onto the wafers. In this view the belts are not shown; rather, the sliders on which the belts move are depicted.

This view also shows in the lower half module 28L, sloping floor plates 76 which are angled to permit run-off of excess condensed acid/water composition into the sump 40. The bottom of the lower half 28L is formed by bottom wall 78 which extends between transverse end-walls 90a and 90b. The remaining numbered parts are as described above.

Figure 8:
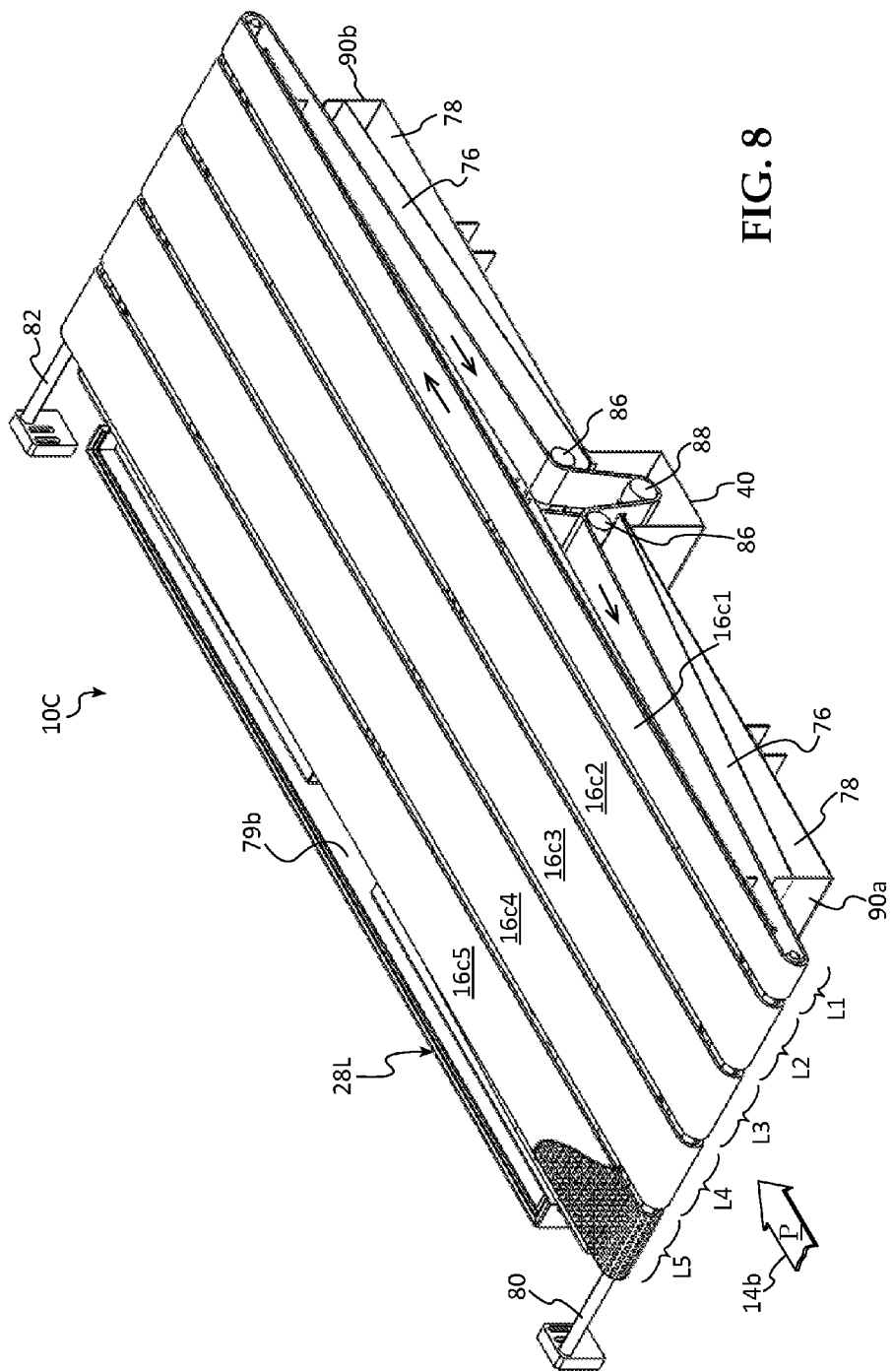
FIG. 8 is an isometric view of the lower half of the inventive doper module with the side walls remove to show the transport belt system, including the belt tensioning and cleaning/sump apparatus.

FIG. 8 is a view of the lower half of the doper module 28L to show the belt path. This view is partly in section with the left side wall 79b shown (the right side wall 79a being removed and thus not shown). The optional longitudinal lower baffle of lane L1 is removed so as to not complicate the drawing. In this view the belts 16c1-16c5 of lanes L1 through L5 are shown beginning from the entry on the left shown by Arrow P. The belts wrap around entry rollers on shaft 80, extend through the doper to the exit rollers on shaft 82 and thence along their return path around the redirecting interface rollers 86 and the tension roller 88 disposed in the sump 40. In one embodiment at the entry end on the left, drive rollers are disposed on jack shaft 82 at the right end, the shaft being driven via a drive gear (not shown mounted thereon) which is connected by a chain to a drive motor (not shown) in conventional manner. On the return path, the belts pass over interface rollers 86 which turn the belts down around the tension roller 88 disposed in the sump 40 where they are washed in water. The sloping drip panels 76 are supported above the bottom panel 78.

Figure 9:
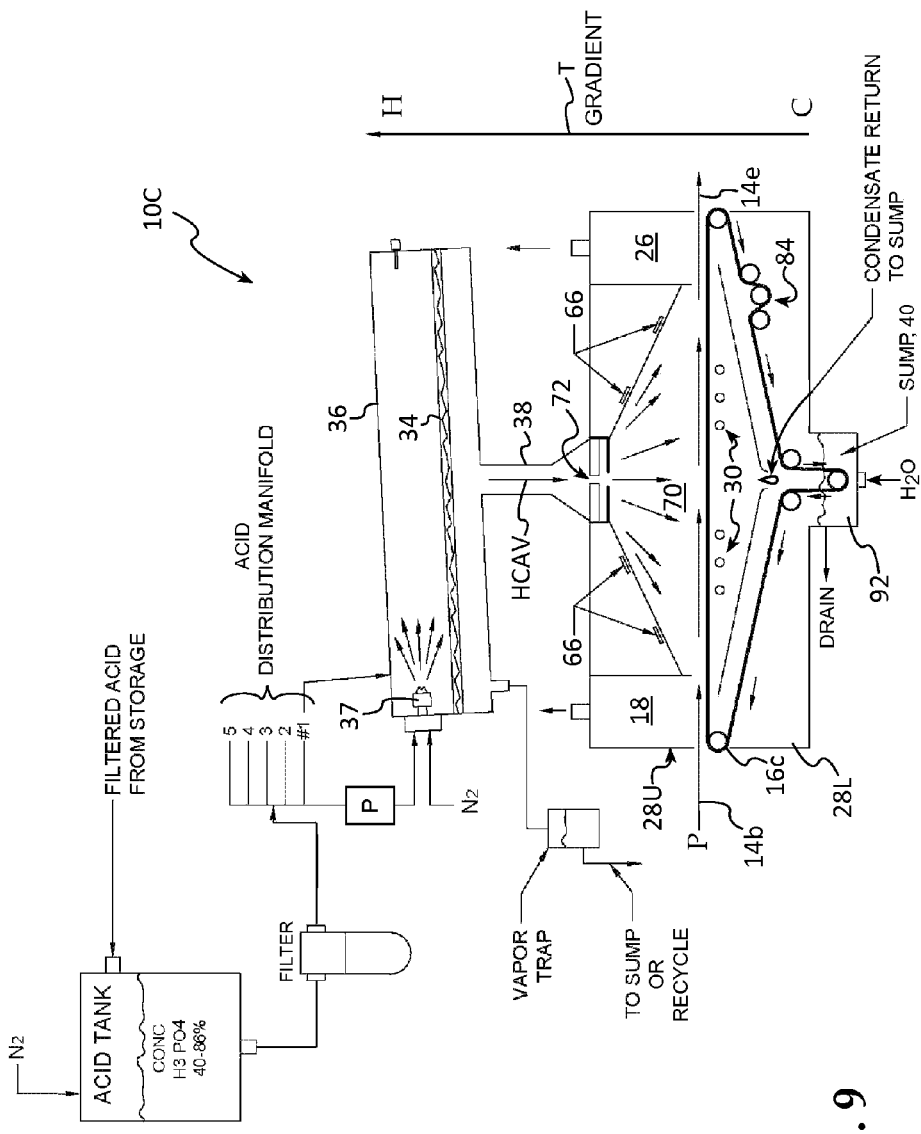
FIG. 9 is an operational flow schematic illustrating the inventive process for doping Si wafers.

FIG. 9 shows schematically the overall operational flow of the inventive process for doping (P) and co-doping (B and P) Si wafers. Following the diagram, filtered concentrated orthophosphoric acid held in storage is pumped to a process acid tank which is maintained under sufficient $N_2$ pressure to prevent infiltration of air and humidity. The acid concentration is in the range of about 40-90%, and preferably in the 60-86% range. The acid is filtered and introduced in the range of from about 0.1 to about 1 gallon per hour, via acid distribution manifold and metering pumps, to each of the five vapor generation chambers (VCG) 36 of a doper 10C where it is atomized in atomizer 37 by pressurized dry, and optionally heated, $N_2$ gas, which is pressure and flow regulated to each VCG. Each VGC 36 is heated by an IR lamp 34 internal to the chamber. Any condensate forming in the VGC 36 is drained and collected in a vapor trap, then routed to the sump 40 or recycled to the process acid tank. The Hot Concentrated Acid Vapor, HCAV is distributed via manifold 38 into the process vapor application (layering) zone 70 of the doper upper portion 28U. Heaters 66 interior of the doper assist in maintaining the proper temperature of the vapor as it enters through slit 72. The transfer belts 16c1-16c5 move the wafers from inlet to outlet, 14b to 14e. During the passage through the vapor application process zone 70, the vapor condenses on the relatively cooler wafers. Excess vapor condenses below the process zone 70 and is returned to the sump 40. The transfer belts are driven by drive system 84, and then washed in the sump by fresh DI water 92. A thermal gradient from cool at the vapor condensation and wafer layering portion of the bottom of the process zone 70 (below the dew point of the concentrated acid) to hot (up to about 200° C.) in the vapor generation zone is maintained during processing operations. To assist in thermal control, cooling means 30 (such as water cooled coils) may be provided below the belts path. In addition, the pressure is maintained slightly positive in the vapor generation zone 36 and the process zone 70, with the condensation below the belt and eductors in the baffles 18 and 26 providing a slightly negative pressure. The result is a functionally sealed process zone.

Figure 10:
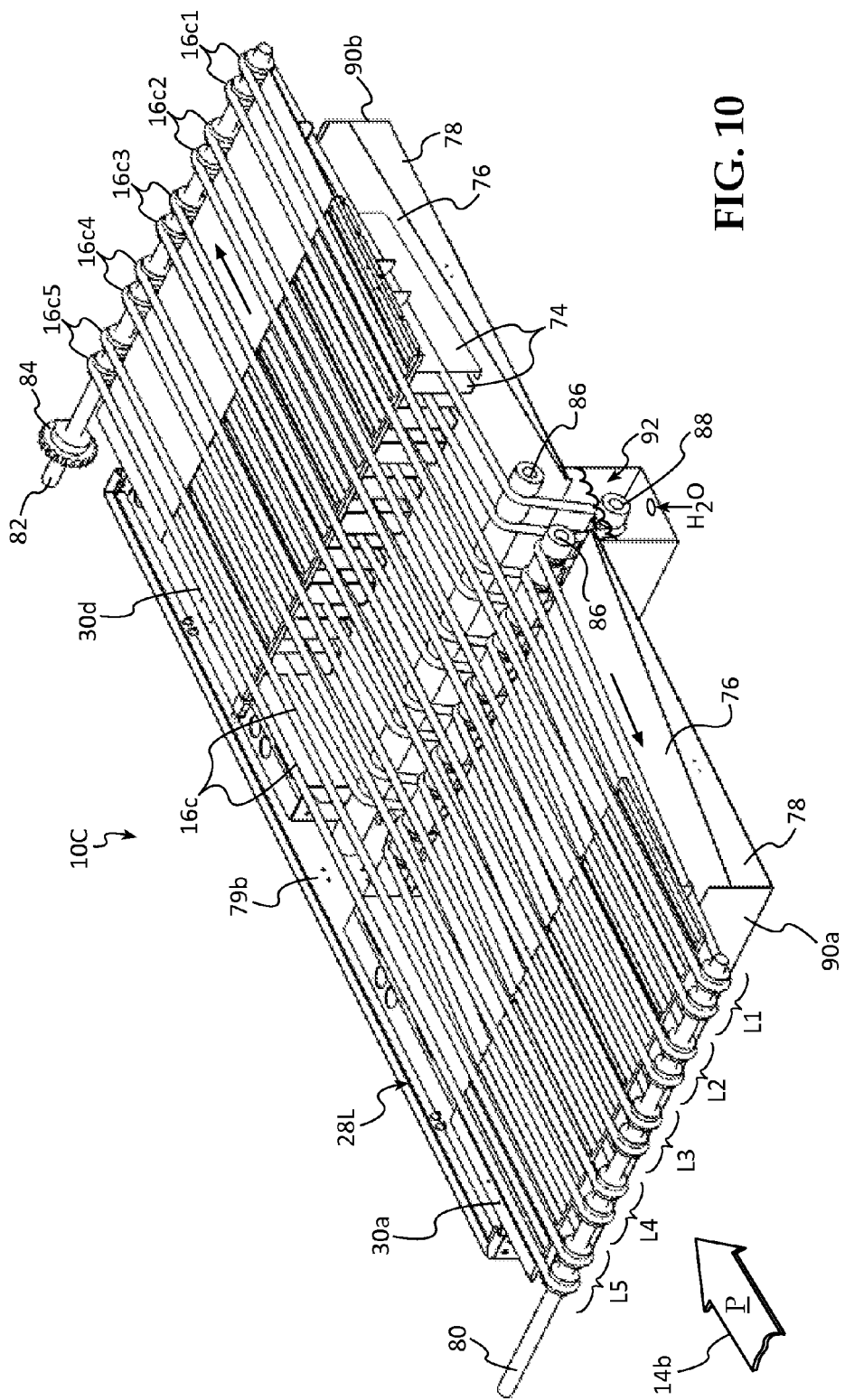
FIG. 10 is an isometric view of the lower half of the inventive doper module with the side walls removed to show the alternative transport system embodiment employing bands, cords or flexible tubing.

FIG. 10 shows an alternate embodiment of the transport system of the inventive doper module. Shown is the lower half of the doper module 28L, again partly in section with the right side wall 79a and left (entry) end baffles of lane L-1 removed. In this view the transport comprises pairs of elastomeric bands, strands or cords, for example, round in cross-section, 16c1-16c5, two laterally spaced apart bands being used per lane for lanes L1 through L5. The wafer path is identified by Arrow P, and the transport bands are shown in their complete path, including the return path around the tension roller 80 at the entry end on the left, the drive rollers on jack shaft 82 at the right end. The drive gear 84 is connected by a chain to a drive motor (not shown) in conventional manner. On the return path, the belts pass over interface rollers 86 which turn the belts down around the tension roller 88 disposed in the sump 40 where they are washed in water 92. The supply of water is shown schematically via bottom inlet and a side overflow drain in FIG. 9 above. Pairs of vertical lower baffles 74 are seen on the right side, but have been removed from the left side for clarity. On the left, the sloping drain sub-panel 76 is seen supported above the bottom panel 78. Exemplary transverse cooling plates 30a, 30d are shown, the cooling water inlet and outlet being omitted for clarity at this scale (see FIGS. 1, 11 and 12 for that detail).

Figure 11:
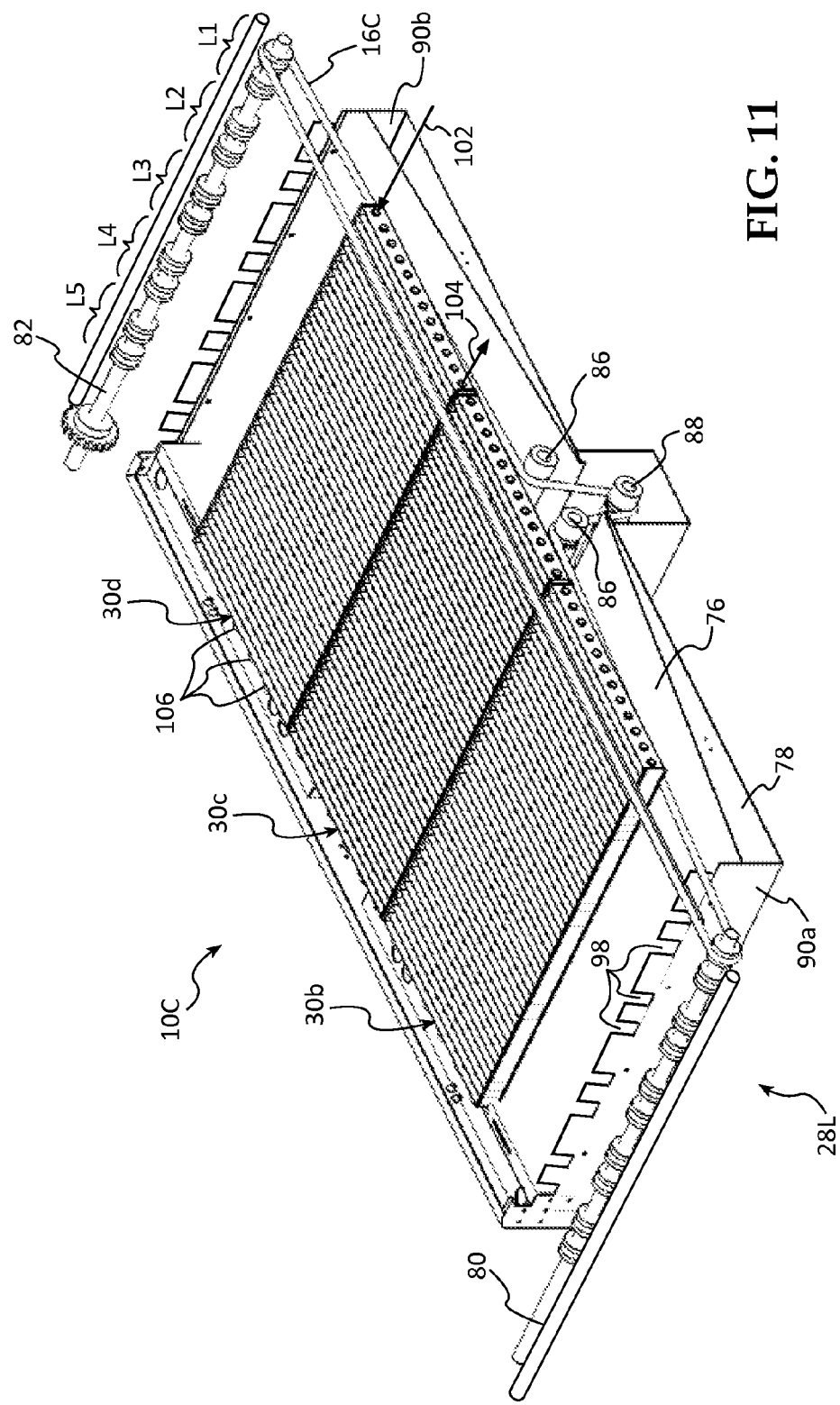
FIG. 11 is an isometric view of the lower half of the inventive doper module with the right side wall and all but one belt removed to show transverse cooling radiators disposed beneath the wafer transport path, and showing the floor condensate return baffles.

FIG. 11 is an isometric view similar to FIGS. 8 and 10 with selected parts removed for clarity. In this view, only one conveyor band 16c of the lane L1 pair is shown, the remaining four pairs of laterally spaced parallel belts for lanes L2 through L5 being omitted for clarity. This view shows additional transverse radiators 30b, 30c and 30d, each comprising sinusoidal copper tubes 106 mounted in fins. Each of the radiator elements 30 includes at least one inlet 102 for chilled water and an outlet 104. In that way the temperature of each zone of the radiators 30a-30d is controlled. For example, in the case of the doper 10C having an internal drying zone (see 32 in FIG. 1) heated water may be used in radiator section 30c, or part thereof. This view also shows the notches 98 in the end walls 90a and 90b of the lower half 28L to provide clearance for the return path of the bands or belts 16c of the transport system.

Figure 12:
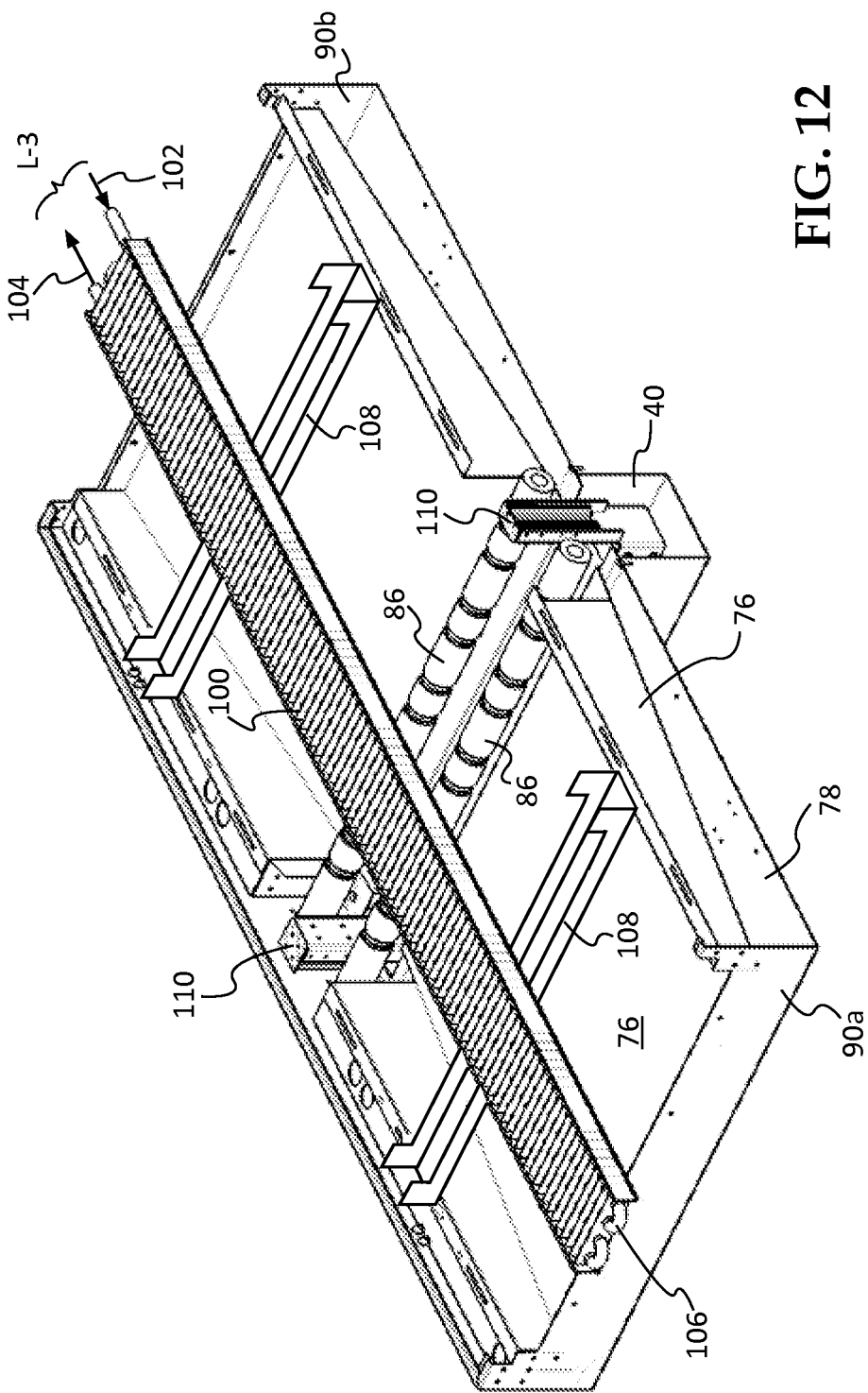
FIG. 12 is an isometric view of the lower half of the inventive doper module with belts removed but showing a second embodiment of a longitudinal cooling radiator, and the vertical tension roller jacks at each end of the belt sump.

FIG. 12 is another isometric from the same perspective as FIGS. 8, 10 and 11 which together may be taken as a progressive series. In this view a plurality of longitudinal radiators 100 are used, one for each lane, the radiator for lane L3 being shown. The inlet 102 and outlet 104 fittings are shown as well as the sinusoidal coolant fluid tubing 106. The radiator elements 100 are supported on cross-members 108. The grooves in the interface rollers 86 maintain the belts in their proper path. This figure also shows linear actuators or lead screws 110 at each end of the tension roller 88 (not shown, see FIG. 9) to vertically position roller 88 to adjust the tension on the belts. The remaining parts are as described above.

Figure 13:
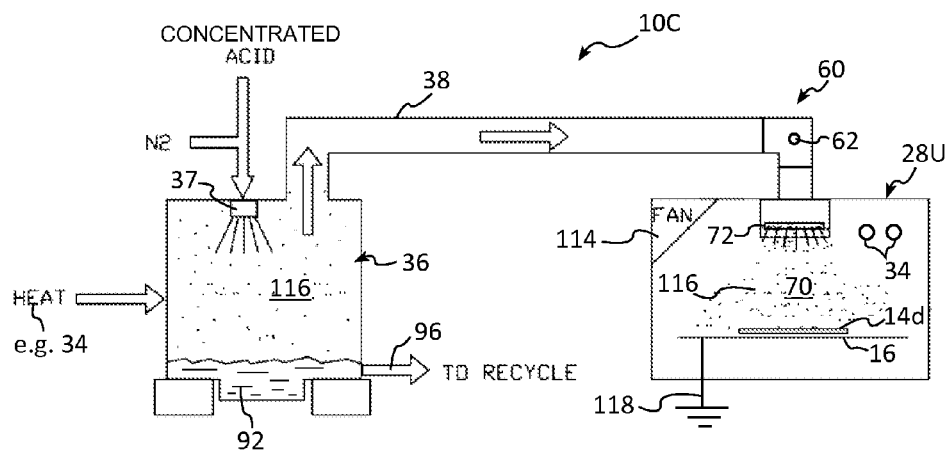
FIG. 13 is a schematic of a second embodiment of the inventive doper module in which the fog prep chamber is separate from the wafer processing chamber and connected thereto via a header, the atomizer nozzle being disposed at the top of a vertical fog prep chamber, and including a plasma generator header just above the wafer processing chamber.
Figure 14:
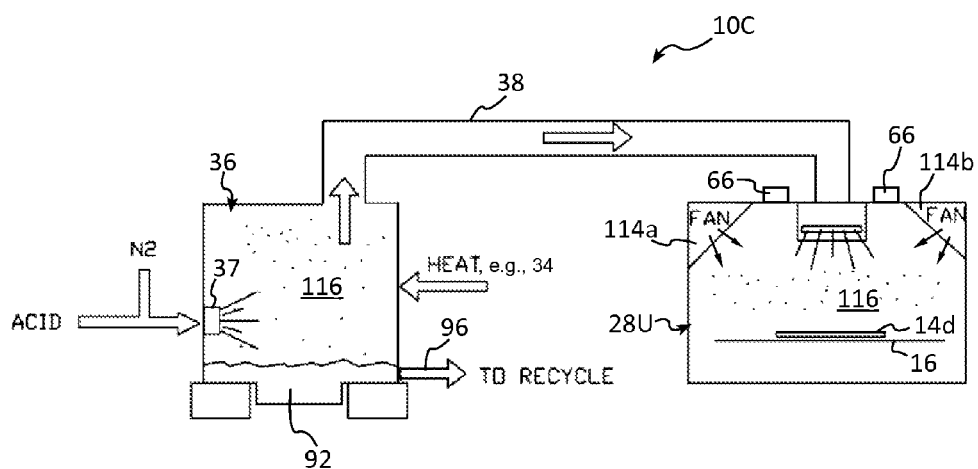
FIG. 14 is a schematic of a second embodiment of the inventive doper module of FIG. 11 in which the atomizer nozzle is located in a side wall of the fog prep chamber.

FIGS. 13 and 14 are schematics of alternate embodiments in which the vapor producing chamber 36 is not mounted, piggy-back style, on top of the upper half 29U of the wafer doping module 10C. In this embodiment, the vapor generating chamber 36 comprises a glass cylinder that is heated from the exterior by thermal heaters (heat coils or heating blanket). A preferred mode of heating the chamber 36 of this embodiment is to use IR lamps 34 arrayed around the circumference oriented vertically parallel to the center axis of the cylinder. In FIG. 13 the concentrated acid/water mixture and $N_2$ gas are introduced at the top of the chamber 36 into the atomizer nozzle 37 to produce the acid vapor 116. Any condensate produced 92 collects at the bottom and is recycled 96 to the process acid tank (See FIG. 9). A heated tube 38 conveys the vapor to the upper half module 28U and into the acid layering wafer processing zone 70 via the slit 72 where the wafers 14d on belts 16 are coated with the acid condensate. In this embodiment an optional fan 114 assists in driving the vapor onto the wafer top surface. Internal IR lamp heaters 34 may be used to maintain the temperature of the vapor or plasma 116 in the process zone 70. Optionally the vapor may be electrified and converted into a hot electrified plasma by a header 60 having suitable electrodes 62. In FIG. 14 the atomizer nozzle 37 is located on a lower side wall of the cylinder instead of the top. The remaining parts and functions are as above-described. Note in this embodiment, a plurality of fans 114a and 114b are used to control and direct the flow of vapor or plasma. Heaters 66 may be used to maintain the vapor or plasma temperature as required.

Figure 15:
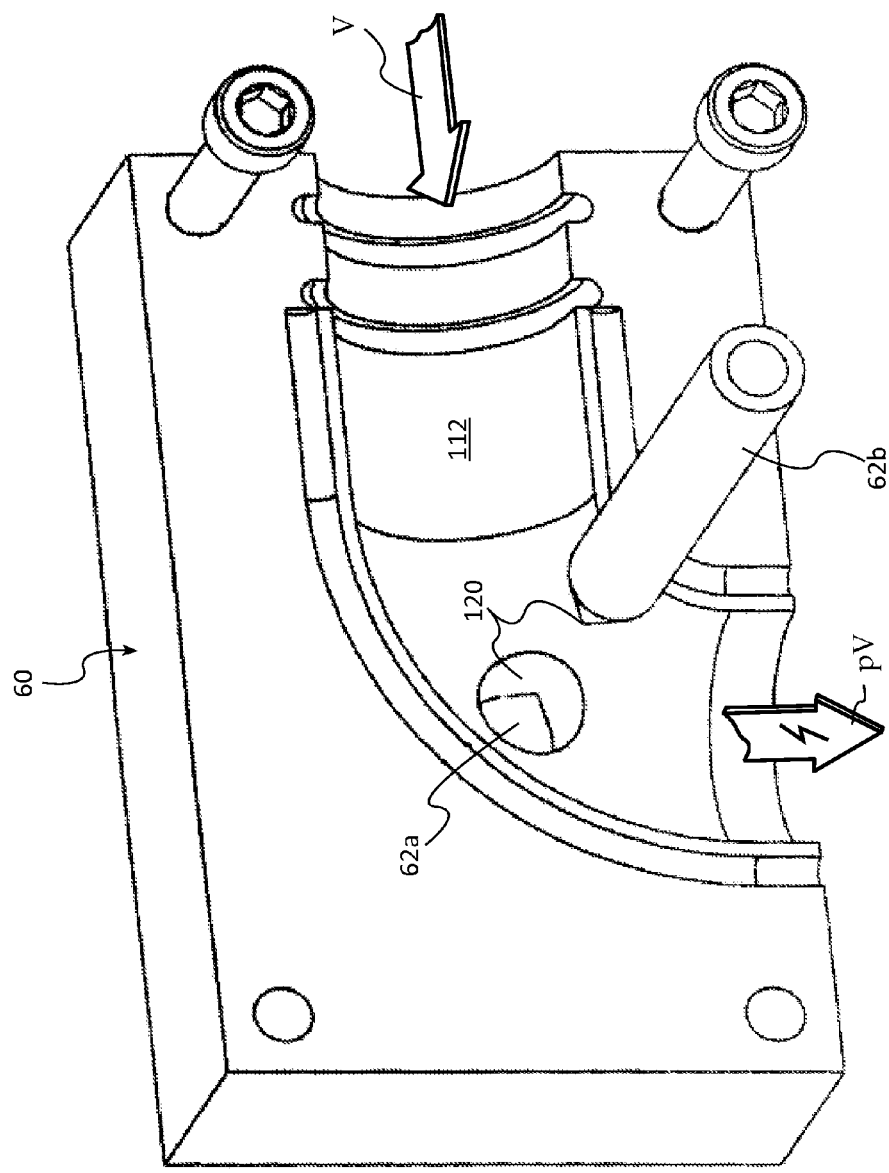
FIG. 15 is a vertical section view of the plasma charge header used in the embodiment of FIG. 13 or/and FIGS. 1-12 and 14.

FIG. 15 is an isometric vertical section view of the plasma header 60 shown in FIG. 13, the vapor flowing from the right as shown by Arrow V into the bore 112 of the header body, past the electrodes (anodes) 62a, 62b to which low voltage on the order of 1000-2000 volts is applied, with the resultant charged plasma vapor or fog exiting down into the acid layering wafer processing zone (70 as seen in FIG. 13) as indicated by Arrow pV. In this embodiment the heated vapor or fog plasma is positively charged and the wafers are negatively charged by use of electrically conductive elastomeric belts 16, which are grounded 118 as seen in FIG. 13. The anode charge gap 120 is adjustable to provide selected charge levels to the heated acid fog passing there-through.

The acid-coated wafers are dried in one or more zones, including the exit baffle zone 26 and the drying muffle 10D, to each or both of which dry air and/or $N_2$ gas and/or heat are selectively provided. The multi-belt transfer system 16c of the doper module 10C discharges the doped wafers 14e directly onto the furnace conveyor system 16e of the diffusion furnace module 10E for continuous processing of solar cell wafers, which are taken off the output end 14e with the p-n junction layer formed. The diffusion furnace 10E includes a plurality of processing zones, including a high-intensity IR lamp firing zone, a soaking zone, and at least one downstream cooling zone. The firing zone may optionally utilize isolation lamp modules for rapid irradiation heating of the wafers to the firing temperature in the range of from about 700° C. to about 1000° C. within a few seconds. The soaking zone preferably also employs high-intensity IR lamps to maintain the wafer temperature in the range of from about 800° to about 950° C. for a time sufficient for the P or B of the dopant composition to migrate into the wafer surface to form the p-n junction layer. Thereafter the wafers are cooled by forced ambient air in the cooling zone down to ambient at 14g for handling in the next downstream processing step apparatus. The furnace conveyor system is preferably a low-mass or near zero mass system, which permits more rapid processing speeds and greater throughput, while conserving energy.

Accordingly, the teachings of this application guide one skilled in the art in the selection of operating parameters, including wafer transport rate, wafer cooling, multi-layering, acid vapor and plasma handling (e.g., flow mass and volume, temperature, acid concentration, flow direction via placement and orientation of vapor knife slits, electrification as fog plasma and optional fan placement and cfm), to provide even and consistent coating of the wafers edge-to-edge and wafer-to-wafer.

INDUSTRIAL APPLICABILITY

It is clear that the inventive doper apparatus and vapor and plasma application methods disclosed have wide applicability to the Silicon wafer processing industry, namely to the doping and diffusion steps of solar cell wafer preparation phases of the over-all solar cell production processes. The inventive system clearly offers substantial improvements in doping of the surface layer of solar cell silicon wafers with P or B by improvements in the uniformity of thickness of the dopant composition, orthogonally across the wafer surface, in the wafer-to-wafer consistency and in the increased throughput to match the downstream diffusion furnaces on a small footprint. Thus, the inventive system has the clear potential of becoming adopted as the new standard for apparatus and methods of doping of crystalline silicon wafers in the solar cell industry.

It should be understood that various modifications within the scope of this invention can be made by one of ordinary skill in the art without departing from the spirit thereof and without undue experimentation. For example, the process chamber can have a wide range of designs to provide the functionalities disclosed herein. Likewise, using the inventive doping composition application apparatus, vapor, fog and plasma deposition may be applied in a wide range of compositions, including both B- and P-containing compositions, and operating conditions, such as pressures, temperatures, flow rates (e.g., in cfm), concentration and the like, all well within the capabilities of those skilled in the art and without undue experimentation, thereby permitting processor customers to develop their own individual, proprietary processing operation. This invention is therefore to be defined by the scope of the appended claims as broadly as the prior art will permit, and in view of the specification if need be, including a full range of current and future equivalents thereof.

---

Parts List (This Parts List is provided as an aid to Examination and may be canceled upon allowance)

10 Inventive Wafer Processing System, 10A-10E
11 Diffusion Furnace UV Pretreatment Zone
12a, b Upper/lower halves, Processing chambers 10A-10E
14 wafers a-g at various processing stages
16a-f multi-belt wafer transport system in 10A-10E
16c1-16c5 transport belts, bands, strands or cords
18 Entry baffles, with air/gas knives, opt. heat/cooling
20 air knives, CDA, heated CDA or $N_2$
21 exhaust stacks
22 UV module lamp chamber
24 UV lamps
25 chilled dry $N_2$ gas -continued Parts List (This Parts List is provided as an aid to Examination and may be canceled upon allowance)

26 Exit baffles, with air/gas knives, opt. heat/cooling
28U, L Wafer Processing chambers, Upper and Lower
30 Cold plates or radiators (Hot or cold)
31 Cold water In
32 Internal drying zone, heat opt air/gas knives
33 Water Out of 30 (warmed)
34 IR lamps
36 Heated/cooled Conc acid Vapor Generation Chamber
37 Atomizing nozzle
38 Acid vapor transfer manifolds, 38a-38e
40 Sump at bottom of 28L
42 Frame members of modules
44 Lifting lead screws, raise upper 12a from lower 12b
46 Entry end wall of 28U
48 Entry slit
49 Access panels
50 Spill tray
52 Internal longitudinal baffles
54 Lifter motors
56 Support brackets for 36
58 Vapor Generation Chamber Drain tube
60 Plasma header(s)
62 Anodes for charging fog
63 Top of 28U
64 Slanted internal top of wafer processing zone 70
66 Heaters
68a, b Common inner transverse end walls for 18, 70, 26
70 Process Vapor Application Zone in 28 U
72 Vapor manifold slit inlet into Zone 70
74 Lower longitudinal baffles between Lines
76 Inclined drip panel or sub-floor in 28L
78 Bottom of doper module 10C process chamber 28L
79 a, b longitudinal outer side walls of 28L
80 Left tension roller (idler)
82 Right driver roller (may be geared to a drive motor)
84 Drive gear
86 Interface rollers
88 Tension roller
90a, b Outer end walls of 28L
92 DI water in sump for cleaning of belts 16
98 Return belt notches in end walls 90
100 Longitudinal Radiator
102 Coolant water inlet to radiators/cooling plates
104 Coolant water outlet from radiators/cooling plates
106 Sinusoidal tube of radiators/cooling plates
108 Radiator/cooling plate supports
110 Tension roller linear actuators or lead screws
112 Bore of fog plasma header
114 Fan(s) internal of Vapor process chamber 70 of 28U
116 Vapor, Fog or Plasma
118 Ground
120 Anode charge gap (adjustable)
V = Heated Vapor, fog; pV = Charged Vapor/Fog plasma
P = Processing path of wafers thru module zones
T = Travel direction of conveyors (& return path)
VGC1 thru VGC5, Vapor Generation Chambers 36a-36e
Lanes = L1 through L5

---

The invention claimed is:

1. A doper assembly for applying a doping composition to at least one surface of a Silicon solar cell wafer for subsequent firing to form an p-n junction or back contact layer, comprising in operative combination:

a. a hot phosphoric or boric acid vapor generation chamber, including:
  i. an atomizer for atomizing highly concentrated liquid dopant acid composition with gas under pressure to create a highly concentrated acid vapor, and
  ii. means for heating said vapor;

b. a continuous conveyor system for transport of cool silicon wafers in a generally horizontal path, said continuous conveyor system includes multiple lanes arrayed side-by-side, each lane having its own at least one transport belt, said belts of all zones being driven in synchrony by a common drive system;
c. a vapor application process chamber having an entry and an exit for said conveyor to transport said wafers through said process chamber, said wafers being oriented during transport with a surface to which said dopant acid composition is to be applied facing upwardly;
d. said vapor generation chamber is disposed in communication with said vapor application process chamber to pass said hot concentrated acid vapor into said application process chamber;
e. said vapor process chamber confining and directing a layer of said acid vapor onto said wafer surface to form a condensation layer of acid thereon; and
f. means for drying said wafers during transport in said horizontal path after formation of an acid vapor condensation layer on said wafer surface to produce doped wafers.

2. A doper assembly as in claim 1 wherein said drying means includes an air knife assembly disposed to provide a flow of dry gas onto said wafer surface as said wafers exit said vapor process chamber.

3. A doper assembly as in claim 1 wherein said drying means includes an IR lamp heater assembly.

4. A doper assembly as in claim 1 wherein said means for heating said vapor in said vapor generation chamber comprises an IR lamp heater assembly.

5. A doper assembly as in claim 1 wherein said vapor application process chamber includes at least one lifter to selectively raise said chamber above said belt to provide service access into said chamber and to lower it for operation.

6. A doper assembly as in claim 1 wherein said vapor application process chamber includes means for cooling said Silicon wafers as they are transported through said process chamber on said conveyor.

7. A doper assembly as in claim 1 which includes a charge header through which said hot concentrated acid vapor is passed to form a hot acid plasma.

8. A doper assembly as in claim 1 which includes a UV pre-treatment assembly upstream of said doper disposed to feed said doper assembly Silicon wafers, said UV pre-treatment assembly comprising a wafer transport assembly above which is disposed a UV chamber in which UV lamps are disposed and said UV lamps are oriented to expose said wafer surface to UV radiation as said wafers are transported through said UV chamber.

9. A doper assembly as in claim 8 wherein said UV pre-treatment assembly includes means for delivering an oxygen-containing gas into said UV chamber.

10. A doper assembly as in claim 8 wherein said UV chamber includes at least one lifter to selectively raise said UV chamber above said UV assembly transport to provide service access into said UV chamber and to lower it for operation, and said UV assembly transport is slaved to said doper conveyor.

11. A doper assembly as in claim 1 which includes a diffusion furnace and is disposed upstream of said diffusion furnace to synchronously feed doped wafers into said furnace for diffusion firing to form said p-n junction or back contact layer in said wafers.

12. A doper assembly as in claim 11 wherein said diffusion furnace includes at least one lifter to selectively raise an upper portion of said diffusion furnace above a fixed lower portion to provide service access to said lower portion, and to lower said upper portion for operation, said diffusion furnace including a transport system that is exposed at the level of said lower portion when said upper portion is lifted.

13. A doper assembly as in claim 11 which includes a doped wafer post-treatment module including UV lamps for UV radiation conditioning doped wafers prior to diffusion firing.

14. A doper UV pre-treatment assembly to feed Silicon solar cell wafers to a phosphoric or boric acid doper assembly, said UV pre-treatment assembly comprising a continuous linear wafer transport assembly, a UV chamber in which UV lamps are disposed above said wafer transport assembly, and said UV lamps are oriented to expose said solar cell wafer surface to be doped to UV radiation as said wafers are transported through said chamber, said UV pre-treatment assembly includes at least one lifter to selectively raise said UV chamber above said wafer transport to provide service access into said UV chamber and to lower it for operation, and said UV pre-treatment wafer transport assembly feeds UV-treated solar cell wafers to a continuous transport assembly of said doper assembly.

15. A doper UV post-treatment assembly to feed P or B-doped Silicon solar cell wafers to a diffusion furnace for diffusion firing of P or B into the surface of said solar cell wafers, said UV post-treatment assembly comprises a P or B-doped wafer post-treatment UV chamber having at least one UV lamp disposed for UV radiation conditioning of the P or B-doped surface of said solar cell wafers prior to said diffusion firing, and said UV pre-treatment assembly includes at least one lifter to selectively raise said UV chamber above said wafer transport to provide service access into said UV chamber and to lower it for operation.

16. A doper UV treatment assembly as in claim 15 wherein said post-treatment chamber is a part of said diffusion furnace.

* * * * *